(12) United States Patent
Seo et al.

(10) Patent No.: US 11,974,391 B2
(45) Date of Patent: Apr. 30, 2024

(54) PRINTED CIRCUIT BOARDS AND MEMORY MODULES

(71) Applicant: SAMSUNG ELECTRONICS CO., LTD., Suwon-si (KR)

(72) Inventors: Dongyoon Seo, Seoul (KR); Hwanwook Park, Suwon-si (KR); Dohyung Kim, Seoul (KR); Bora Kim, Seoul (KR); Seungyeong Lee, Suwon-si (KR); Wonseop Lee, Daegu (KR); Yunho Lee, Yongin-si (KR); Yejin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 197 days.

(21) Appl. No.: 17/573,156

(22) Filed: Jan. 11, 2022

(65) Prior Publication Data
US 2022/0408550 A1    Dec. 22, 2022

(30) Foreign Application Priority Data
Jun. 21, 2021    (KR) .................. 10-2021-0079747

(51) Int. Cl.
*H05K 1/02* (2006.01)
*G11C 11/4076* (2006.01)
*H05K 1/11* (2006.01)

(52) U.S. Cl.
CPC ........ *H05K 1/0268* (2013.01); *G11C 11/4076* (2013.01); *H05K 1/11* (2013.01);
(Continued)

(58) Field of Classification Search
CPC ..... G11C 11/4076; G11C 5/04; G11C 7/1063; H05K 1/0268; H05K 1/0298; H05K 1/11;
(Continued)

(56) References Cited

U.S. PATENT DOCUMENTS 6,232,559 B1    5/2001  Janecek
6,297,458 B1   10/2001  McMillan et al.
(Continued)

FOREIGN PATENT DOCUMENTS

KR    10-2001-0059516    7/2001

*Primary Examiner* — Vinh P Nguyen
(74) *Attorney, Agent, or Firm* — F. Chau & Associates, LLC

(57) ABSTRACT

A PCB includes a plurality of layers spaced apart in a vertical direction, a first detection pattern and a second detection pattern and pads connected to the first detection pattern and the second detection pattern. The first detection pattern and the second detection pattern are provided in a respective one of a first layer and a second layer adjacent to each other such that the first detection pattern and the second detection pattern are opposed to each other. The pads are provided in an outmost layer. Each of the first detection pattern and the second detection includes at least one main segment extending in at least one of first and second horizontal directions and a diagonal direction. A time domain reflectometry connected to a pair of pads detects a misalignment of the PCB by measuring differential characteristic impedance of the first detection pattern and the second detection pattern.

20 Claims, 19 Drawing Sheets

(52) U.S. Cl.
CPC ... *H05K 1/116* (2013.01); *H05K 2201/09445* (2013.01); *H05K 2201/09481* (2013.01); *H05K 2201/10159* (2013.01)

(58) Field of Classification Search
CPC ......... H05K 1/116; H05K 2201/09445; H05K 2201/09481; H05K 2201/10159; H05K 3/4638
See application file for complete search history.

(56) References Cited

U.S. PATENT DOCUMENTS

| | | | |
|---|---|---|---|
| 6,391,669 B1 * | 5/2002 | Fasano | H05K 3/4638 438/18 |
| 6,922,062 B2 | 7/2005 | Sparkman | |
| 7,388,394 B1 * | 6/2008 | Primavera | H05K 3/4638 324/750.3 |
| 7,545,651 B2 * | 6/2009 | Goodwin | G11C 5/04 361/764 |
| 7,982,487 B2 * | 7/2011 | Lorenz | G01R 31/2818 324/754.1 |
| 8,508,248 B1 * | 8/2013 | Chengson | G01R 31/2812 324/763.01 |
| 8,659,315 B2 | 2/2014 | Pupalaikis et al. | |
| 9,978,655 B2 | 5/2018 | Scanlan et al. | |
| 11,678,437 B2 * | 6/2023 | Seok | H05K 1/0248 361/737 |
| 2008/0190651 A1 | 8/2008 | Klamminger et al. | |

* cited by examiner

101a

PRINTED CIRCUIT BOARDS AND MEMORY MODULES

CROSS-REFERENCE TO RELATED APPLICATION

This application claims priority under 35 U.S.C. § 119 to Korean Patent Application No. 10-2021-0079747, filed on Jun. 1, 2021 in the Korean Intellectual. Property Office, the disclosure of which is incorporated by reference in its entirety herein.

TECHNICAL FIELD

Example embodiments relate to memory devices, and more particularly, to printed circuit boards and memory modules including the same.

DISCUSSION OF RELATED ART

In a memory module, a plurality of semiconductor memory devices are mounted on a printed circuit board (PCB) that includes a plurality of layers. When a misalignment in the PCB occurs, characteristic of signals passing through the PCB at a relatively high speed may be degraded. Therefore, defective PCBs having misalignment can be identified by detecting the misalignment in the PCB.

SUMMARY

Some example embodiments provide a PCB capable of detecting a misalignment of the PCB nondestructively.

Some example embodiments provide a memory module including a PCB capable of detecting a misalignment of the PCB nondestructively.

According to an embodiment of the present disclosure, a printed circuit board (PCB) comprises a plurality of layers spaced apart from one another in a vertical direction. The plurality of layers includes a first layer and a second layer adjacent to each other in the vertical direction. A first detection pattern and a second detection pattern are disposed in a respective one of the first layer and the second layer. The first detection pattern and the second detection pattern are opposed to each other in the vertical direction. A plurality of pads is connected to the first detection pattern and the second detection pattern. The plurality of pads is disposed in an outmost layer from among the plurality of layers. Each of the first detection pattern and the second detection includes at least one main segment extending in at least one of a first horizontal direction, a second horizontal direction perpendicular to the first horizontal direction and a diagonal direction between the first horizontal direction and the second horizontal direction. A pair of pads from among the plurality of pads are connected to a time domain reflectometry (TDR). The TDR is configured to detect a misalignment of the PCB by measuring a differential characteristic impedance of the first detection pattern and the second detection pattern at the pair of pads.

According to an embodiment of the present disclosure, a printed circuit board (PCB) comprises a plurality of layers spaced apart from one another in a vertical direction. The plurality of layers includes a first reference layer and a second reference layer. A detection pattern is disposed in an intermediate layer positioned between the first reference layer and the second reference layer in the vertical direction. A pad is connected to the detection pattern. The pad is disposed in an outmost layer from among the plurality of layers. An end of the detection pattern in a first horizontal direction is aligned with edges of the first reference layer and the second reference layer and the detection pattern extends in a second horizontal direction perpendicular to the first horizontal direction. The pad is connected to a time domain reflectometry (TDR). The TDR is configured to detect a misalignment of the PCB by measuring a characteristic impedance of the detection pattern.

According to an embodiment o the present disclosure, a memory module comprises a printed circuit board (PCB). A plurality of semiconductor devices is mounted on the PCB. Each of the plurality of semiconductor devices includes a memory cell array to store data. A registered clock driver (RCD) is mounted on the PCB. The RCD is configured to receive a command and an access address from an external device and to provide the command acid the access address to the plurality of semiconductor memory devices. The PCB includes a plurality of layers spaced apart from one another in a vertical direction. The plurality of layers includes a first layer and a second layer adjacent to each other in the vertical direction. A first detection pattern and a second detection pattern are disposed in the first layer and the second layer. The first detection pattern and the second detection pattern are opposed to each other in the vertical direction. A plurality of pads is connected to the first detection pattern and the second detection pattern. The plurality of pads is disposed in an outmost layer among the plurality of layers. Each of the first detection pattern and the second detection includes at least one main segment extending in at least one of a first horizontal direction, a second horizontal direction perpendicular to the first horizontal direction and a diagonal direction between the first horizontal direction and the second horizontal direction. A pair of pads from among the plurality of pads are connected to a time domain reflectometry (TDR). The TDR is configured to detect a misalignment of the PCB by measuring a differential characteristic impedance of the first detection pattern and the second detection at the pair of pads.

Accordingly, the PCB according to example embodiments includes a first detection pattern and a second detection pattern provided in respective one of a first layer and a second layer adjacent to each other from among a plurality of layers and a TDR detects a misalignment of the PCB by measuring a differential characteristic impedance of the first detection pattern and the second detection pattern. Therefore, the TDR may detect a misalignment of the PCB nondestructively and may screen defective PCBs.

BRIEF DESCRIPTION OF THE DRAWINGS

Example embodiments of the present disclosure will be more clearly understood from the following detailed description taken in conjunction with the accompanying drawings.

Figure 1:
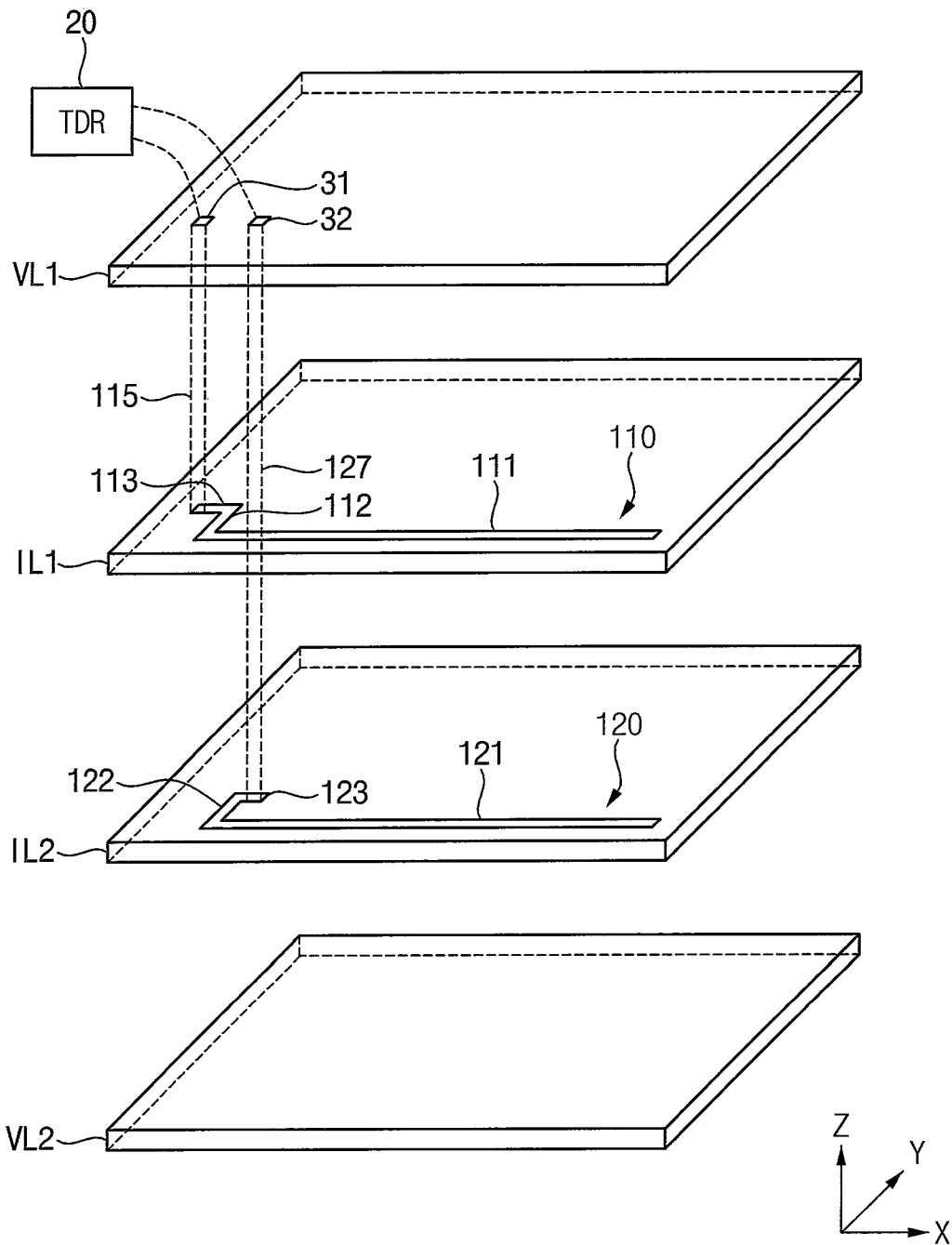
FIG. 1 is an exploded perspective view of a printed circuit board (PCB) according to an embodiment of the present disclosure.
Figure 4:
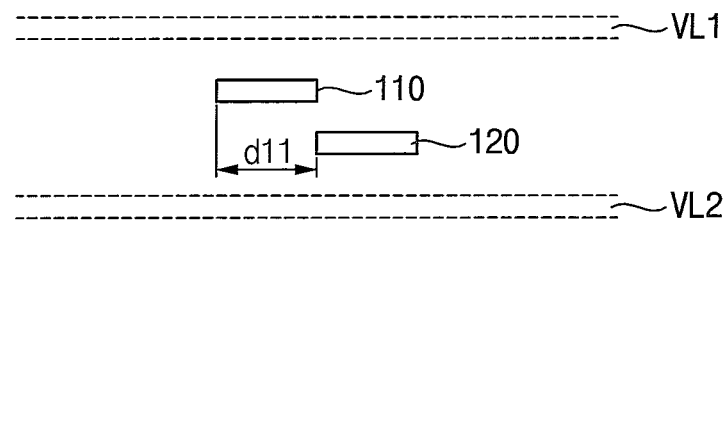
Figure 5:
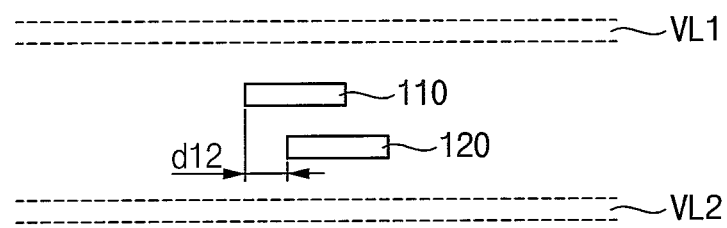
Figure 5:
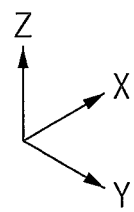

Each of FIGS. 4 and 5 illustrates that a misalignment occurs in the PCB of FIG. 1 according to an embodiment of the present disclosure.

Figure 6:
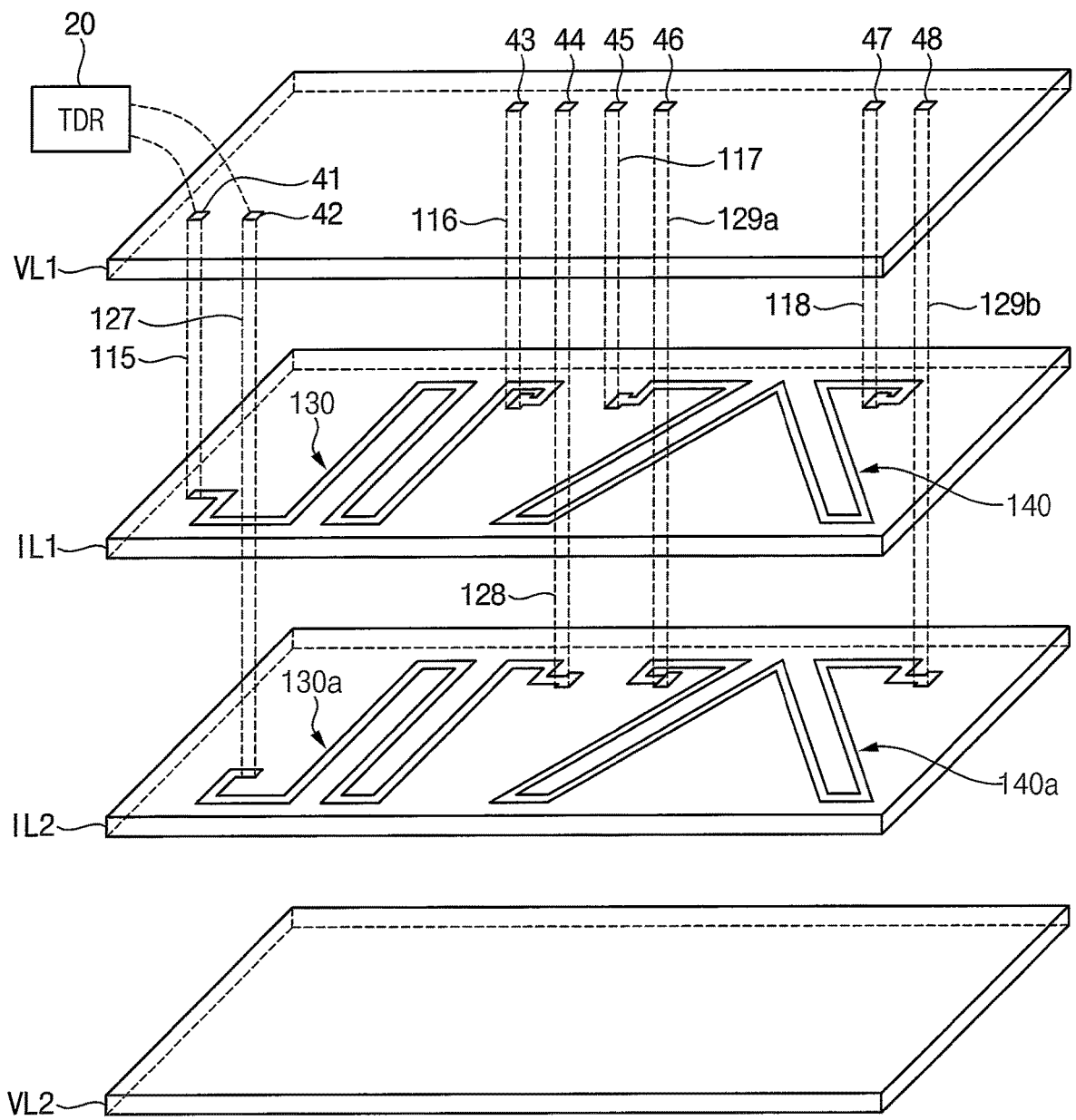

FIG. 6 is an exploded perspective view of a PCB according to an embodiment of the present disclosure.

Figure 7:
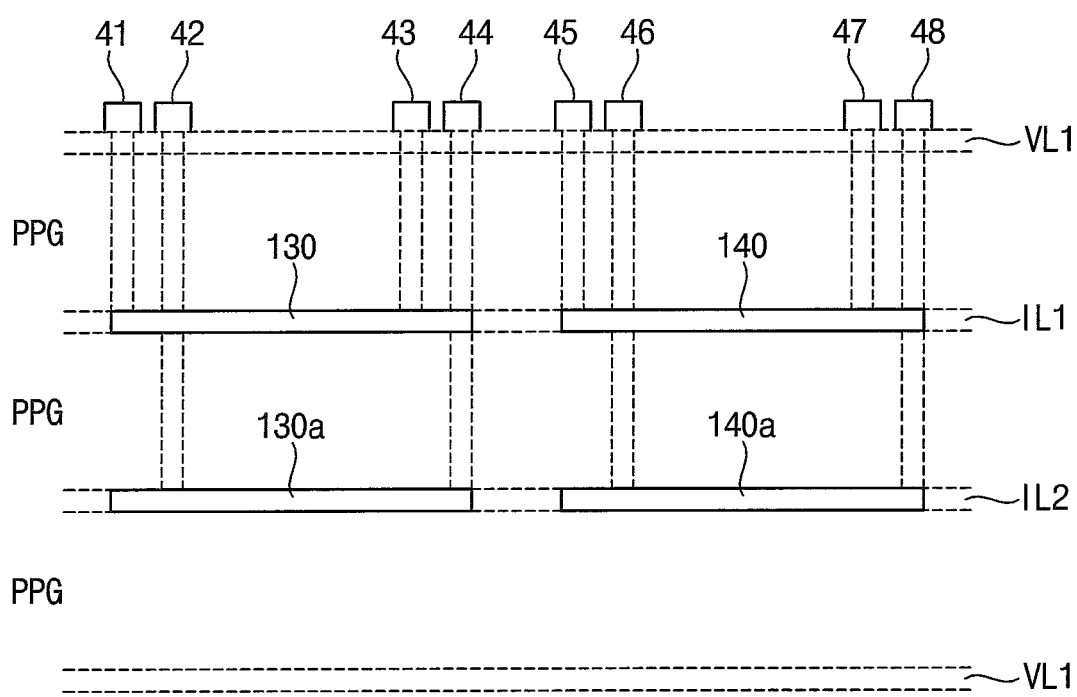

FIG. 7 is cross-sectional view of the PCB of FIG. 6 according to an embodiment of the present disclosure.

Figure 8:
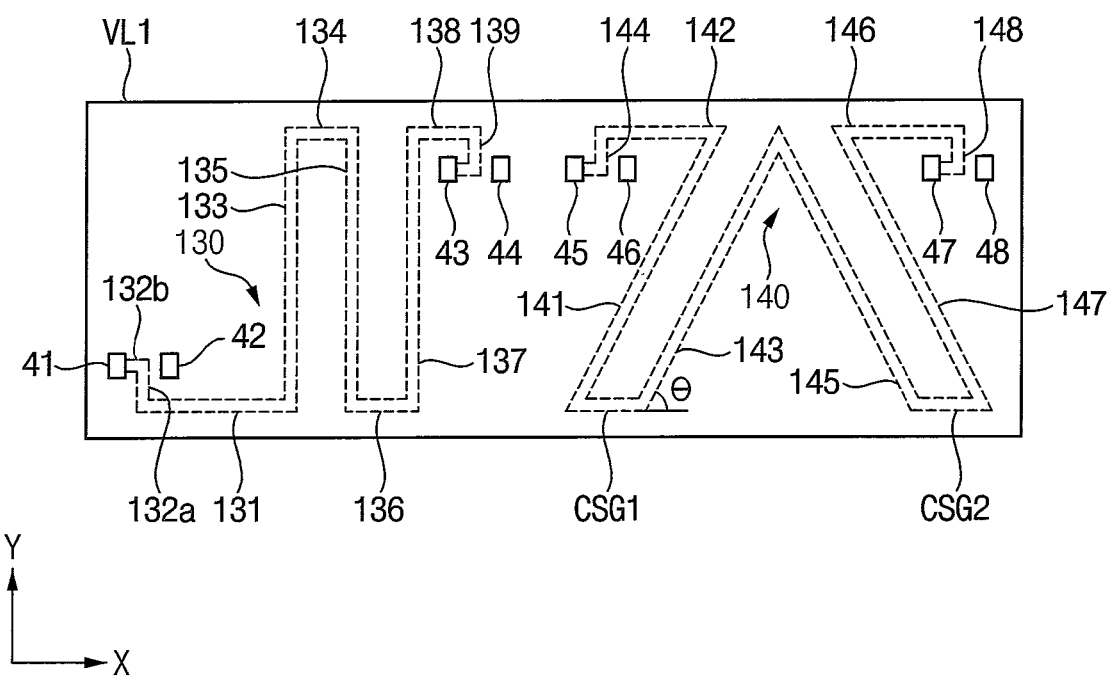

FIG. 8 is a plan view of the PCB of FIG. 6 according to an embodiment of the present disclosure.

Figure 9:
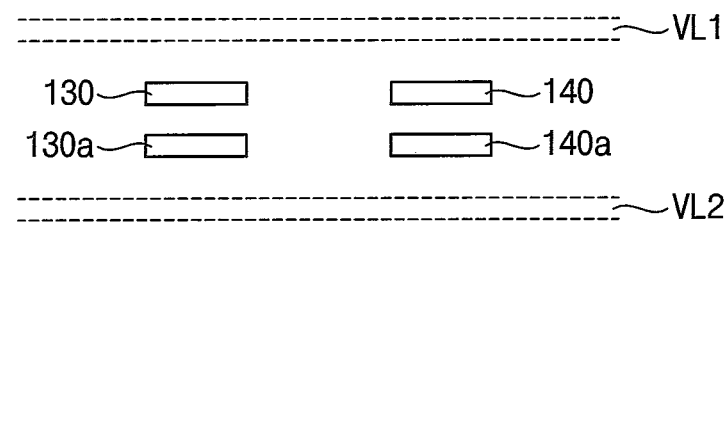

FIG. 9 illustrates that a misalignment does not occur in the PCB of FIG. 6 according to an embodiment of the present disclosure.

Figure 10:
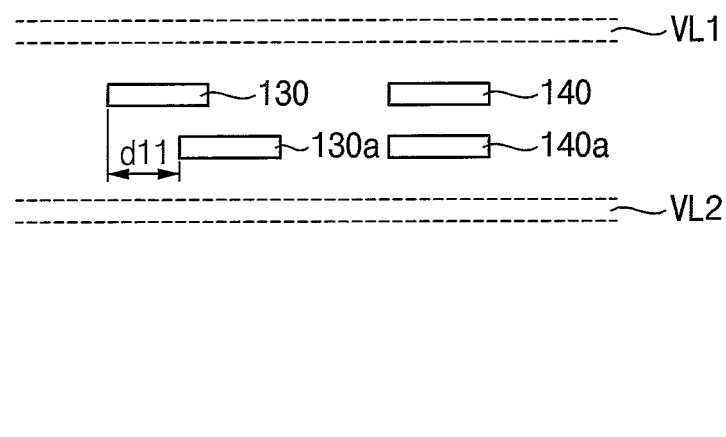
Figure 11:
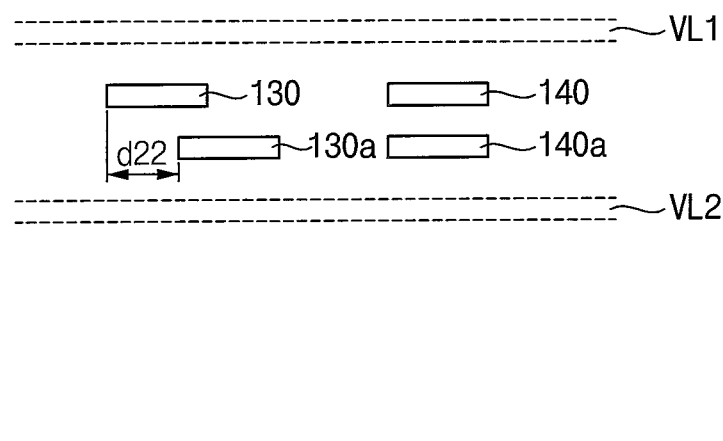
Figure 12:
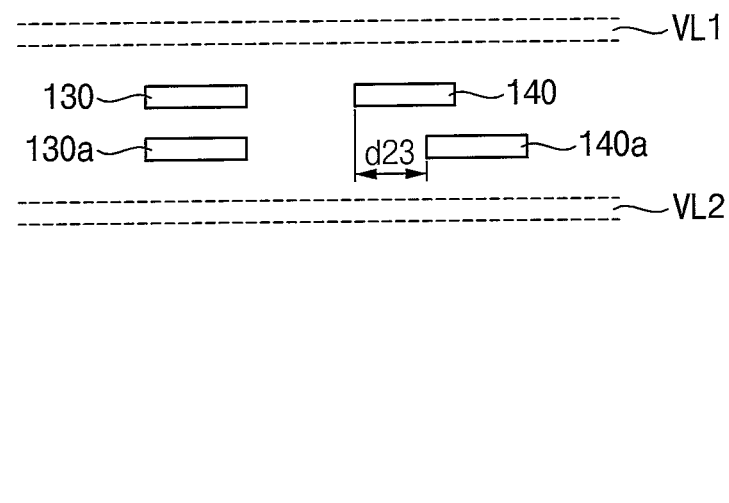

Each of FIGS. 10, 11 and 12 illustrates that a misalignment occurs in the PCB of FIG. 9 according to embodiments of the present disclosure.

Figure 13:
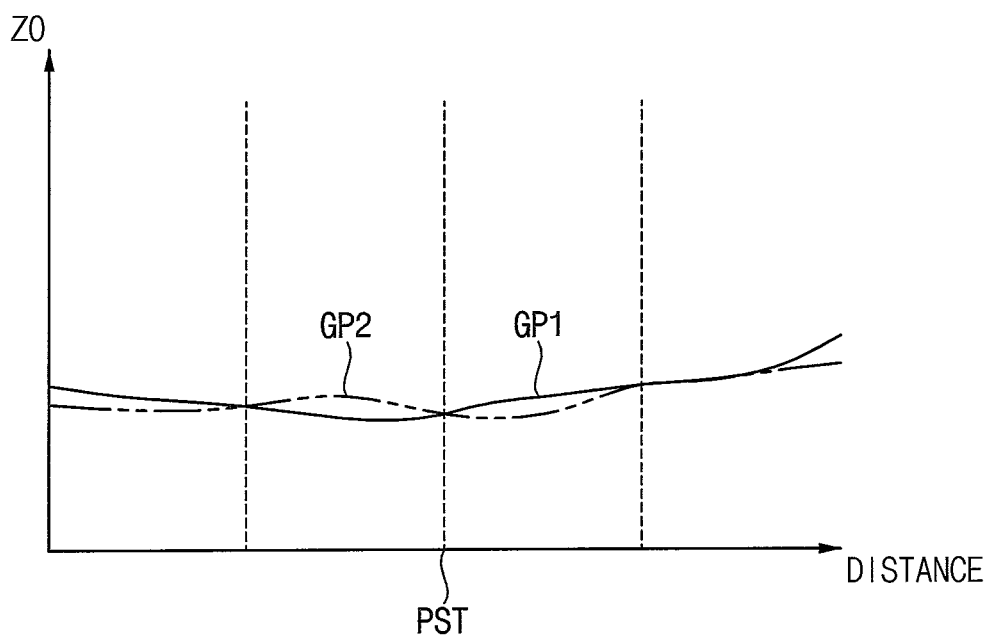

FIG. 13 illustrates a differential characteristic impedance measured in the PCI of FIG. 6 using the TDR according to an embodiment of the present disclosure.

Figures 14, 15:
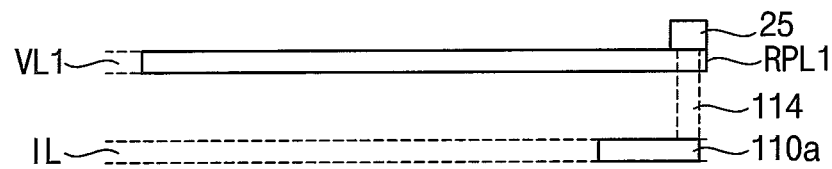

FIG. 14 is a cross-sectional view of a PCB according to an embodiment of the present disclosure.

FIG. 15 illustrates that a misalignment occurs in the PCB of FIG. 14 according to an embodiment of the present disclosure.

Figure 16A:
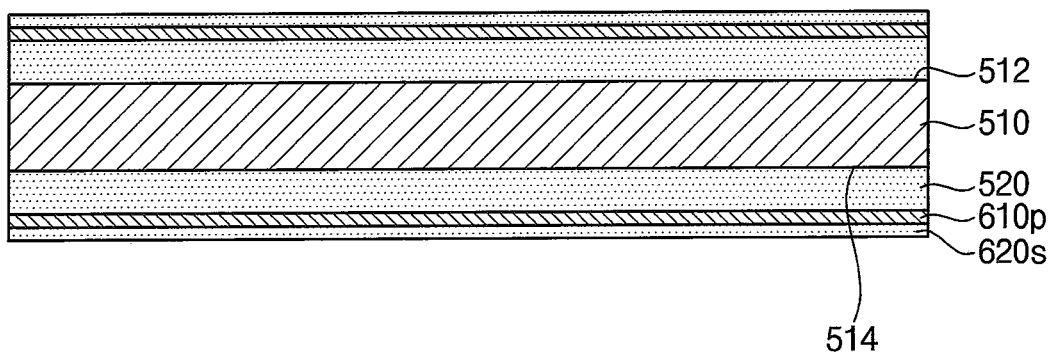
Figure 16A:
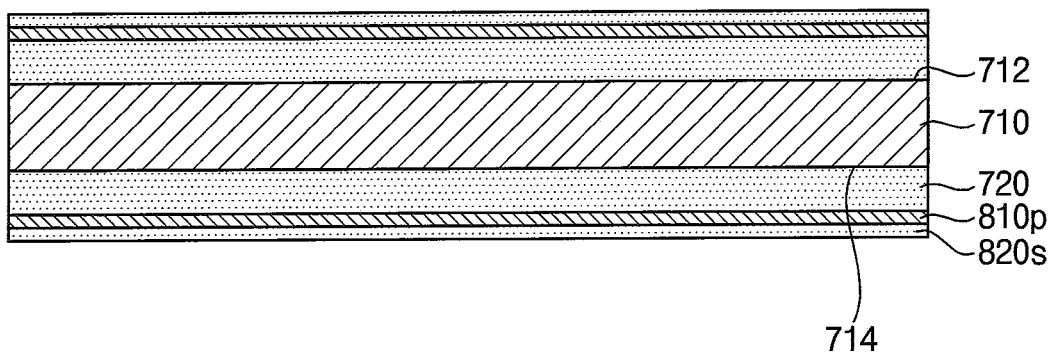
Figure 16B:
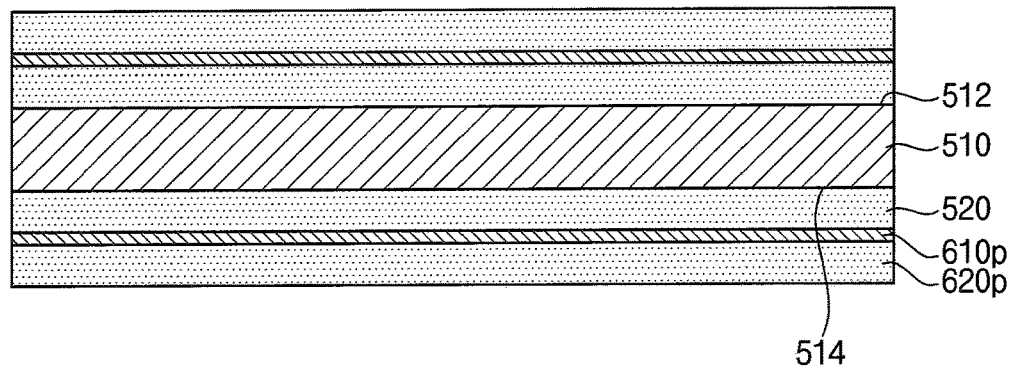

FIGS. 16A through 16B are cross-sectional diagrams showing a method of manufacturing a PCB according to according to embodiments of the present disclosure.

Figure 17:
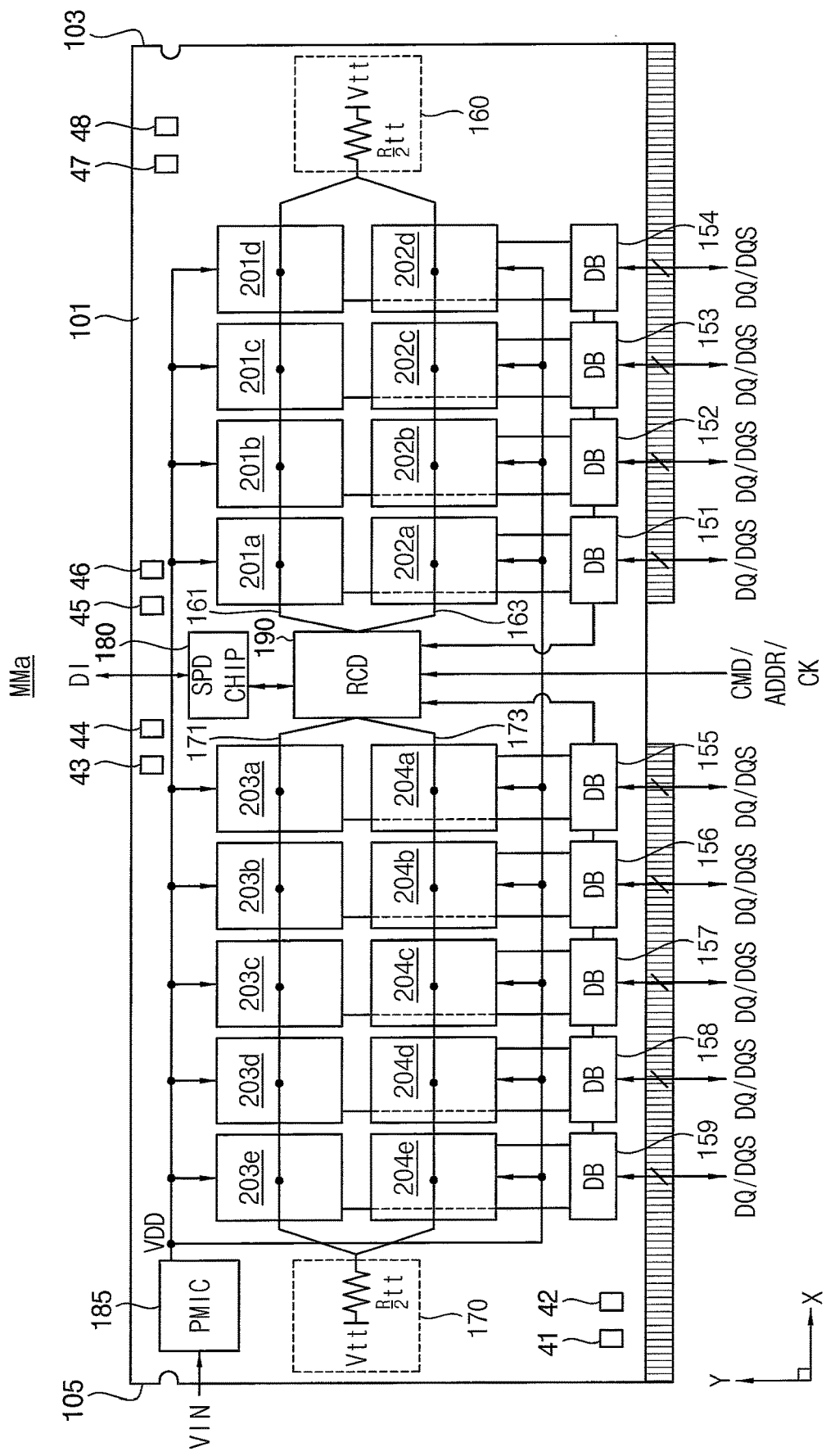

FIG. 17 is a block diagram illustrating a memory module according to an embodiment of the present disclosure.

Figure 18:
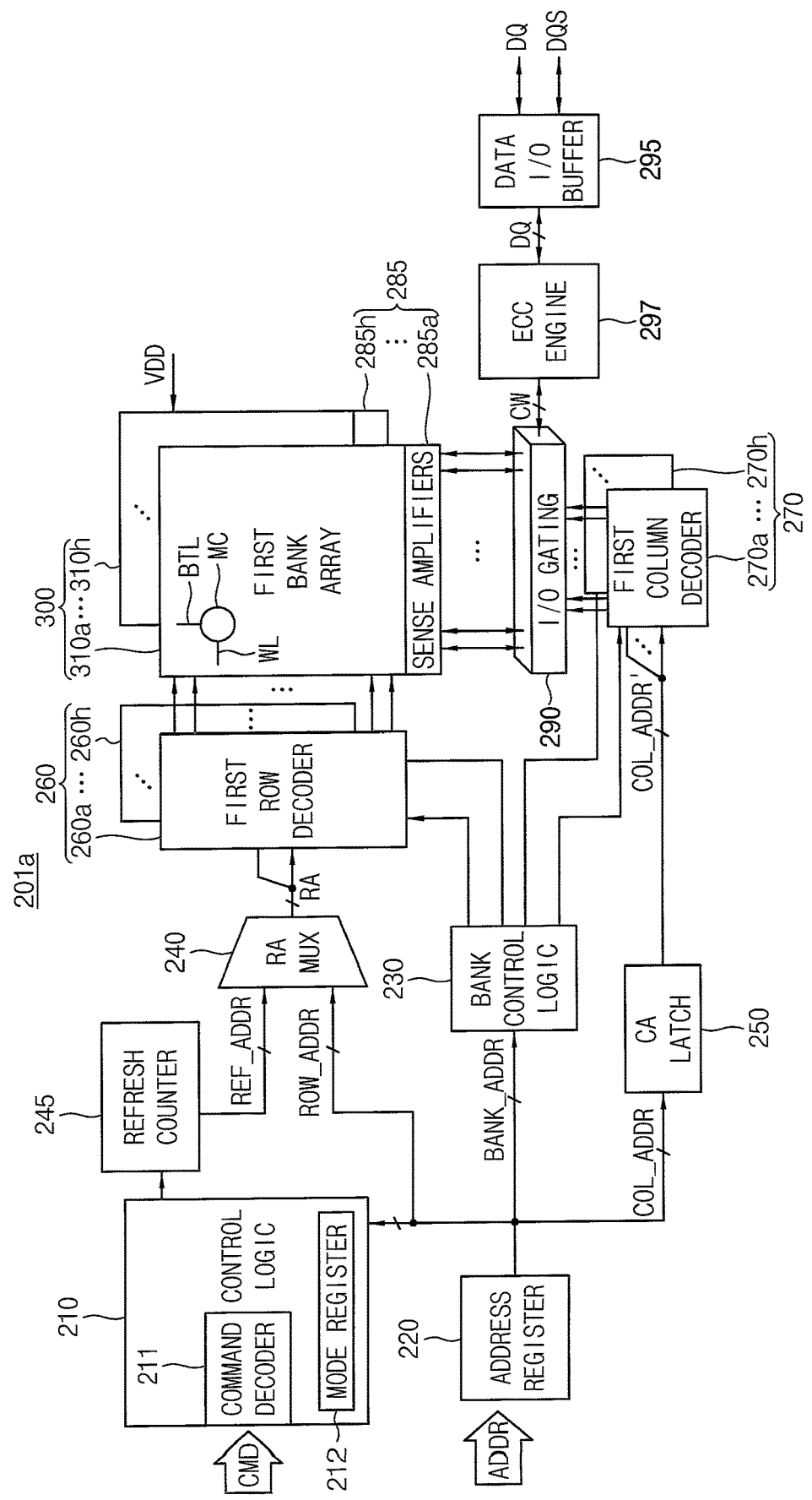

FIG. 18 is a block diagram illustrating one of the semiconductor memory devices memory module of FIG. 17 according to an embodiment of the present disclosure.

Figure 19:
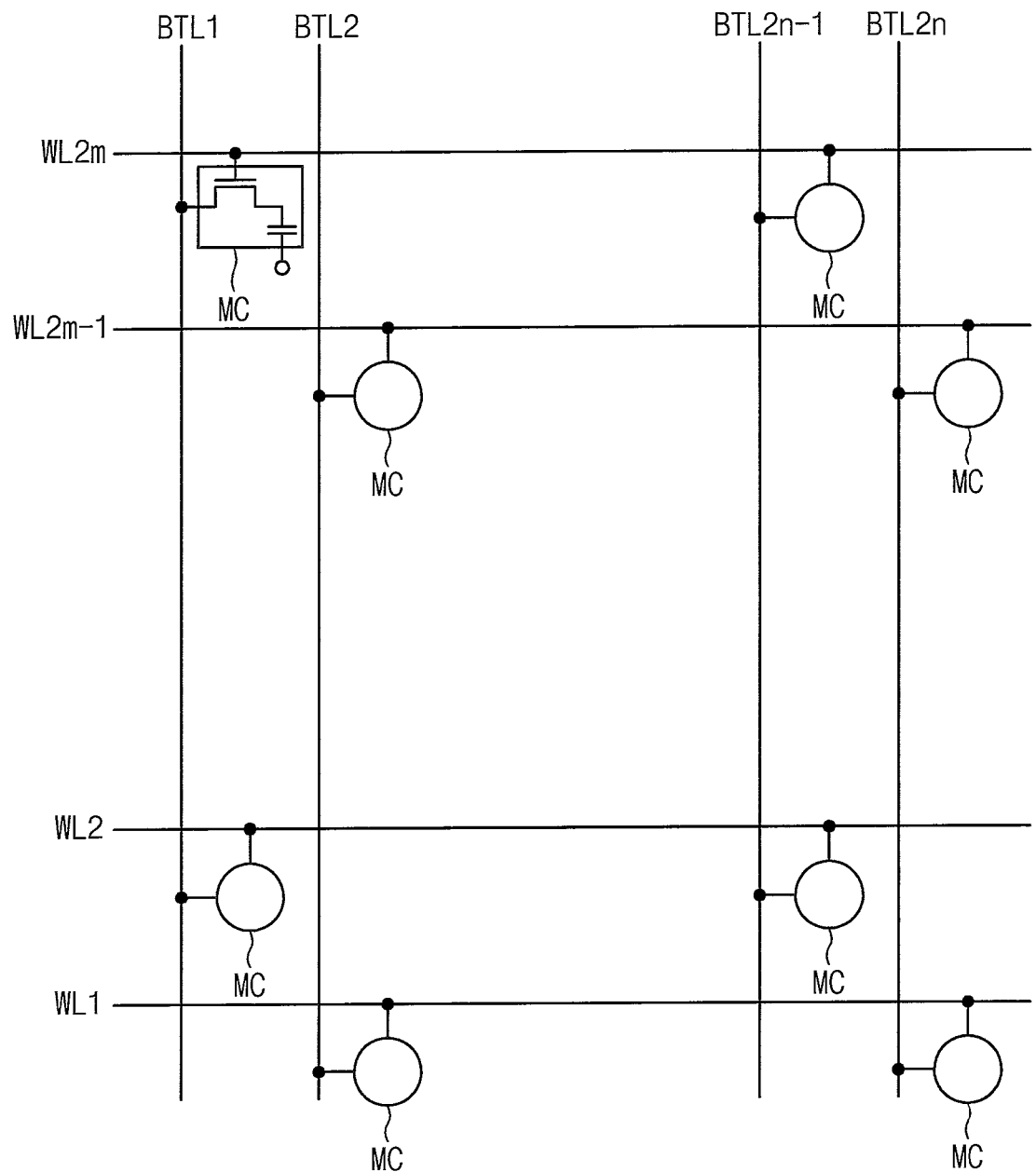

FIG. 19 illustrates a first bank array of the semiconductor memory device of FIG. 18 according to an embodiment of the present disclosure.

Figure 20:
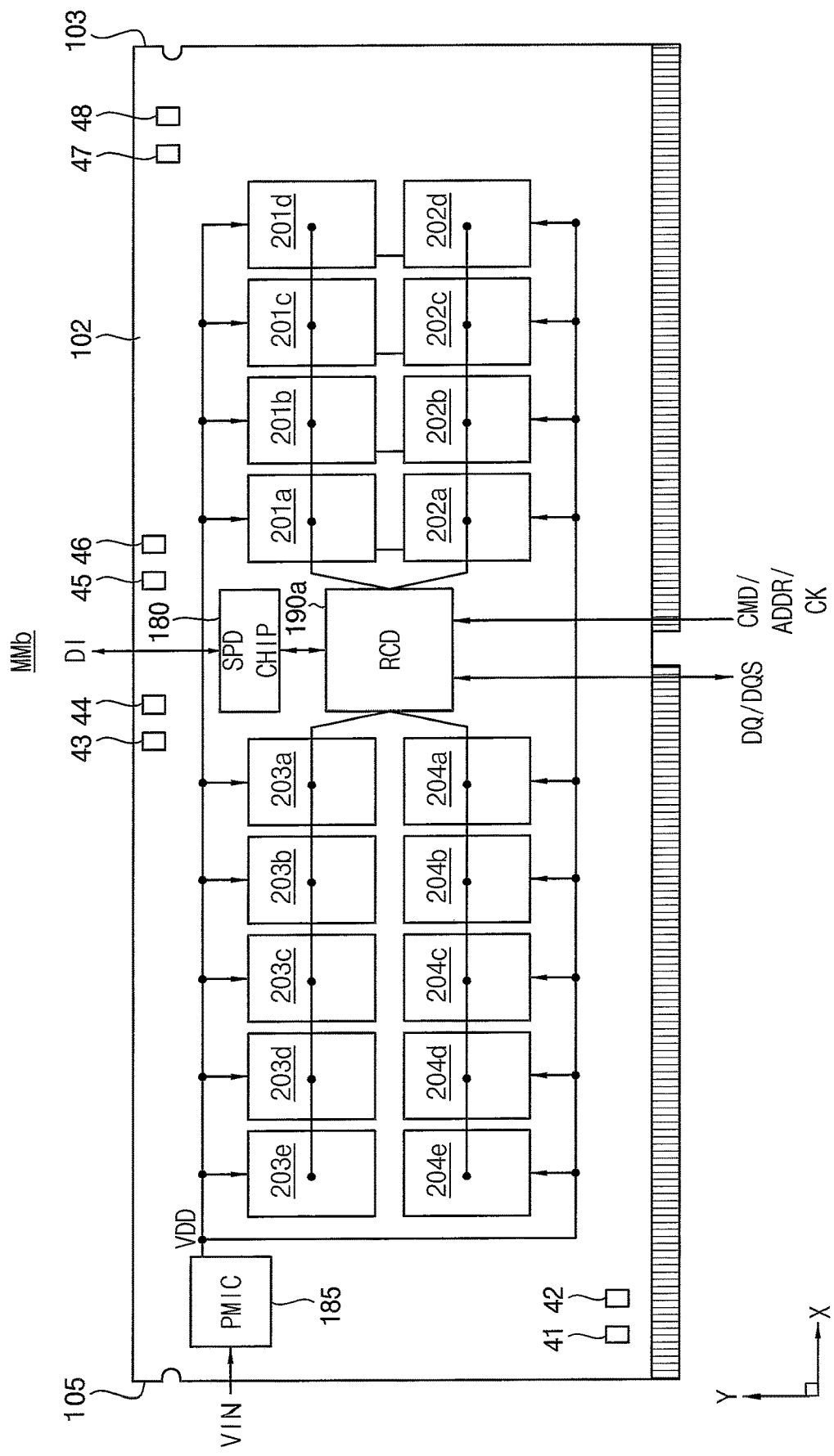

FIG. 20 is a block diagram illustrating an example of the memory module according to an embodiment of the present disclosure.

Figure 21:
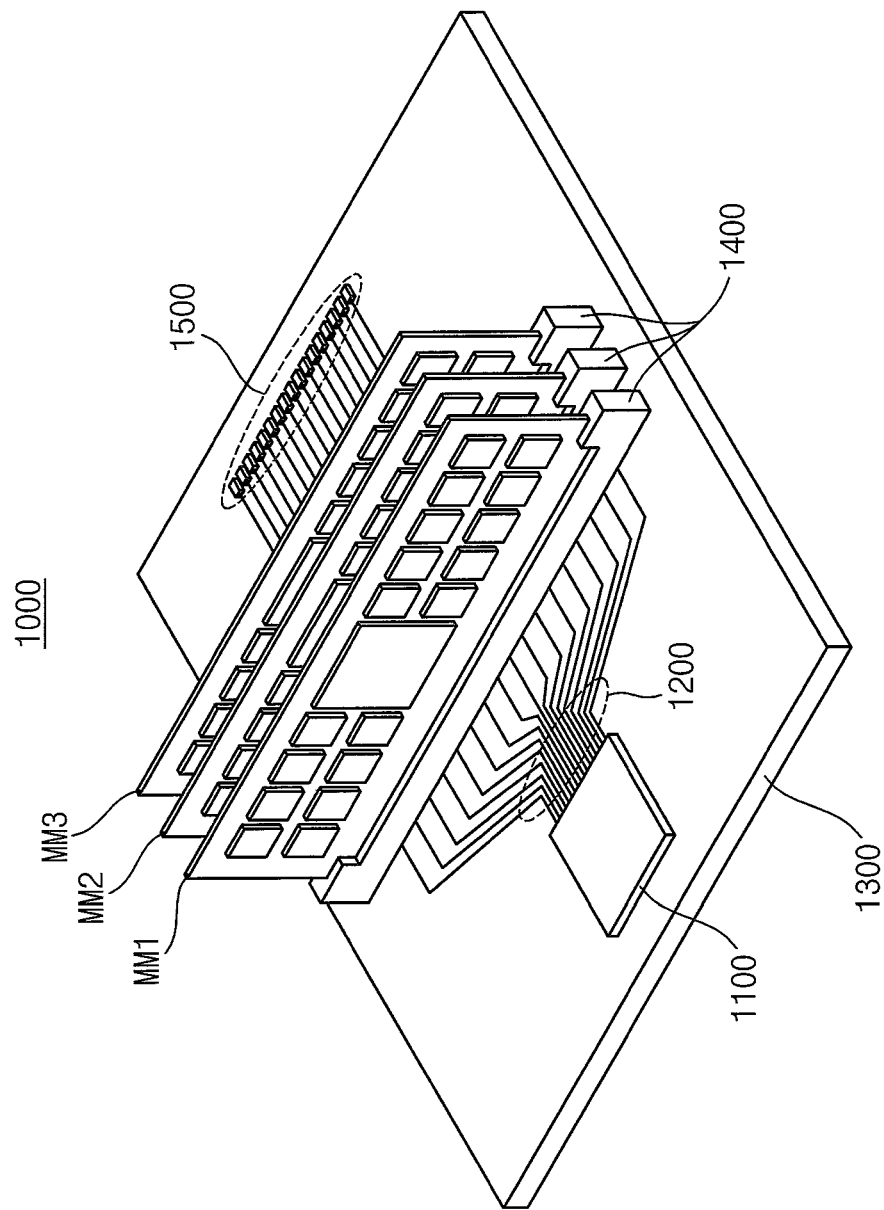

FIG. 21 is a perspective view illustrating a memory system according to an embodiment of the present disclosure.

DETAILED DESCRIPTION OF EMBODIMENTS

Various example embodiments will be described more fully hereinafter with reference to the accompanying drawings, in which some example embodiments are shown. In the drawings, like numerals refer to like elements throughout. The repeated descriptions may be omitted fear economy of explanation.

Figure 2:
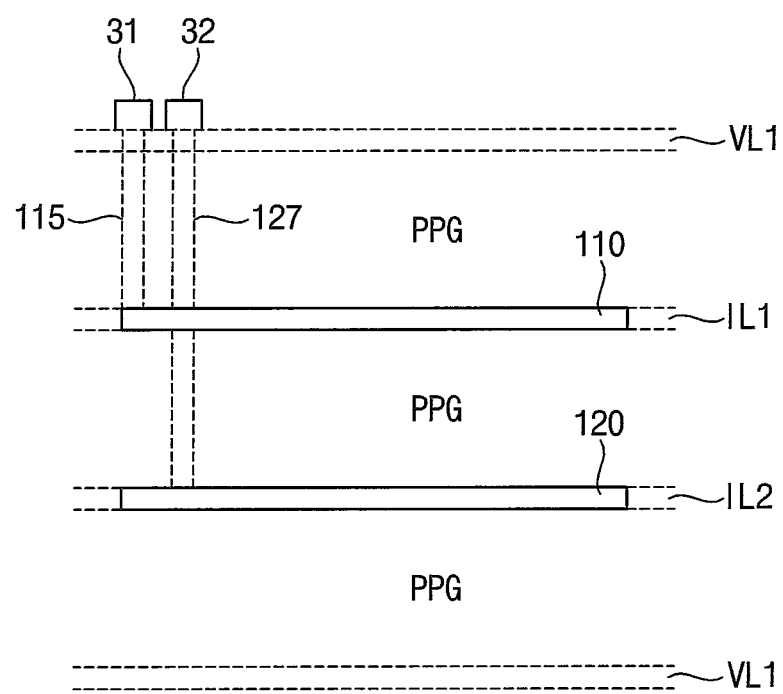
FIG. 2 is cross-sectional view of the PCB of FIG. 1 according to an embodiment of the present disclosure.

FIG. 1 is a perspective view of a printed circuit hoard (PCB) according to example embodiments and FIG. 2 is cross-sectional view of the PCB of FIG. 1 according to example embodiments.

Referring to FIGS. 1 and 2, a PCB 101a may include a plurality of layers VL1, IL1, IL2 and VL2 spaced apart from one another in a vertical direction Z. A first detection pattern 110 and a second detection pattern 120 may be disposed in a respective one of a first layer IL1 and a second layer IL2 adjacent to each other in the vertical direction Z from among the plurality of layers VL1, IL1, IL2 and VL2 such that the first detection pattern 110 and the second detection pattern 120 are opposed to each other (e.g., in the vertical direction Z).

A plurality of pads connected to the first detection pattern 110 and the second detection pattern 120 may be provided in an outmost layer VL1 from among, the plurality of layers VL1, IL1, IL2 and VL2.

A first pad 31 of the plurality of pads may be coupled to the first detection pattern 110 through a first via 115 and a second pad 32 of the plurality of pads may be coupled to the second detection pattern 120 through a second via 127.

The first detection pattern 110 and the second detection pattern 120 are formed to be opposed with respect to each other and form a capacitive coupling in the vertical direction Z.

Hereinafter, a term "segment" is used to indicate a portion of a detection pattern as opposed to an entire detection pattern, and segments may be connected sequentially to form one detection pattern.

The first detection pattern 110 may include a first main segment 111, a first sub segment 112 and a second sub segment 113.

In an embodiment, the first main segment 111 extends longitudinally in a first horizontal direction X and the first sub segment 112 is coupled to the first main segment 111 and extends longitudinally in a second horizontal direction Y perpendicular to the first horizontal direction X. The second sub segment 113 is coupled to the first sub segment 112 and extends longitudinally in the first horizontal direction X. In an embodiment, the first pad 31 may be coupled to an end of the first main segment 111 of the first detection pattern 110. For example, an end of the second sub segment 113 may be coupled to the first pad 31 through the first via 115.

The second detection pattern 120 may include a second main segment 121, a first sub segment 122 and a second sub segment 123.

In an embodiment, the second main segment 121 extends longitudinally in the first horizontal direction X and the first sub segment 122 is coupled to the second main segment 121 and extends longitudinally in the second horizontal direction Y. The second sub segment 123 is coupled to the first sub segment 112 and extends longitudinally in the first horizontal direction X. In an embodiment, the second pad 32 may be coupled to an end of the second main segment 121 of the second detection pattern 120. For example, an end of the second sub segment 123 may be coupled to the second pad 32 through the second via 127.

In an embodiment, the first detection pattern 110 and the second detection pattern 120 may include conductive patterns and may form a broadside coupler.

In an embodiment, a time domain reflectometry (TDR) 20 may be connected to the first pad 31 and the second pad 32. The TDR 20 may measure a differential characteristic impedance of the first detection pattern 110 and the second detection pattern 120 at the first pad 31 and the second pad 32 and may detect a misalignment of the PCB 101a based on change of a value of the measured differential characteristic impedance.

When a misalignment in the first horizontal direction X occurs in the PCB 101a, the amount of an overlapping portion in the first horizontal direction X between the first main segment 111 and the second main segment 121 is reduced and thus, a capacitive coupling in the vertical direction Z, provided between the first main segment 111 and the second main segment 121 may be reduced.

When the capacitive coupling in the vertical direction Z, provided between the first main segment 111 and the second main segment 121 is reduced, the value of the differential characteristic impedance of the first detection pattern 110 and the second detection pattern 120, measured by the TDR 20, may be reduced. Therefore, the TDR 20 may detect whether the misalignment occurs in the PCB 101a based on change of the value of the differential characteristic impedance of the first detection pattern 110 and the second detection pattern 120.

In an embodiment, respective gaps between the plurality of layers VL1, IL1, IL2 and VL2 may be filled with a prepreg PPG. In an embodiment, the layers and VL2 from among the plurality of layers VL1, IL1, IL2 and VL2 are voltage layers and may be connected to a power supply voltage or a around voltage.

Figure 3:
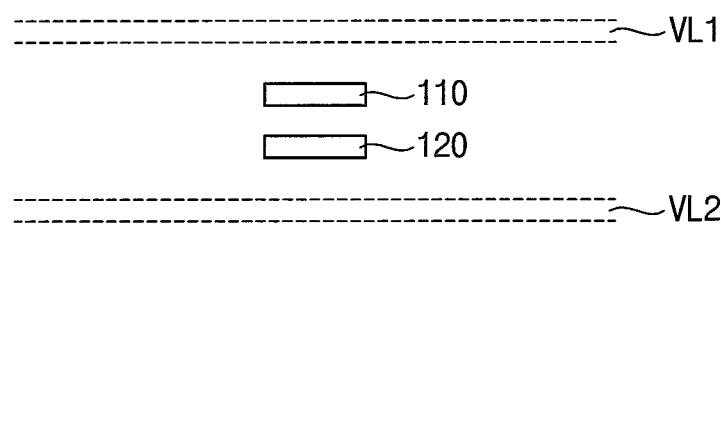
FIG. 3 illustrates that a misalignment does not occur in the PCB of FIG. 1 according to an embodiment of the present disclosure.

FIG. 3 illustrates an instance in which a misalignment does not occur in the PCB of FIG. 1 and each of FIGS. 4 and 5 illustrates instances in which misalignments occur in the PCB of FIG. 1.

Referring to FIG. 3, when the misalignment does not occur in the PCB 101a and the PCB 101a has a normal alignment, the first detection pattern 110 and the second detection pattern 120 are overlapped with respect to each other in the vertical direction Z.

Referring to FIG. 4, when the misalignment in the second horizontal direction Y occurs in the PCB 101a, the first detection pattern 110 and the second detection pattern 120 are spaced apart from each other by a distance d11 in the second horizontal direction Y, and thus a non-overlapping portion in the vertical direction Z between the first detection pattern 110 and the second detection pattern 120 may increase.

Referring to FIG. 5, when the misalignment occurs in a diagonal direction between the first horizontal direction X and the second horizontal direction Y the PCB 101a, the first detection pattern 110 and the second detection pattern 120 are spaced apart from each other by a distance d12 in the diagonal direction, and thus a non-overlapping portion in the vertical direction Z between the first detection pattern 110 and the second detection pattern 120 may increase.

The TDR 20 may measure a differential characteristic impedance of the first detection pattern 110 and the second detection pattern 120 through the first pad 31 and the second pad 32 and may detect the misalignment of the PCB 101a based on a change of the differential characteristic impedance.

FIG. 6 is a perspective view of a PCB according to example embodiments, FIG. 7 is cross-sectional view of the PCB of FIG. 6 according to example embodiments and FIG. 8 is a plan view of the PCB of FIG. 6 according to example embodiments.

FIG. 8 is a plan view of a PCB 101b of FIG. 6 with respect to a first voltage layer VL1.

Referring to FIGS. 6, 7 and 8, the PCB 101b may include a plurality of layers VL1, IL1, IL2 and VL2 spaced apart from one other in the vertical direction Z. A first detection pattern 130 and a second detection pattern 130a may be disposed in a respective one of the first layer IL1 and the second layer IL2 adjacent to each other in the vertical direction Z from among the plurality of layers VL1, IL1, IL2 and VL2 such that the first detection pattern 130 and the second detection pattern 130a are opposed to each other (e.g., in the vertical direction Z).

In addition, a third detection pattern 140 and a fourth detection pattern 140a may be provided in a respective one of the first layer IL1 and the second layer IL2 adjacent to each other in the vertical direction Z such that the third detection pattern 140 and the fourth detection pattern 140a are opposed to each other (e.g., in the vertical direction Z). The third detection pattern 140 may be separate from the first detection pattern 130 (e.g., spaced apart from each other in the first horizontal direction X) and the fourth detection pattern 140a may be separate from the second detection pattern 130a (e.g., spaced apart from each other in the first horizontal direction X).

A plurality of pads connected to the first detection pattern 130 and the second detection pattern 130a may be provided in an outmost layer VL1 from among the plurality of layers VL1, IL1, IL2 and VL2. In addition, a plurality of pads connected to the third detection pattern 140 and the fourth detection pattern 140a may be disposed in the outmost layer VL1.

A first pad 41 may be coupled to the first detection pattern 130 through a first via 115, a second pad 42 may be coupled to the second detection pattern 130a through a second via 127, a third pad 43 may be coupled to the first detection pattern 130 through a third via 116 and a fourth pad 44 may be coupled to the second detection pattern 130a through a fourth via 128.

A fifth pad 45 may be coupled to the third detection pattern 140 through a fifth via 117, a sixth pad 46 may be coupled to the fourth detection pattern 140a through a sixth via 129a, a seventh pad 47 may be coupled to the third detection pattern 140 through a seventh via 118 and an eighth 48 may be coupled to the fourth detection pattern 140a through an eighth via 129b.

As shown in FIG. 8, in an embodiment, the first detection pattern 130 may include a first main segment 131, a second main segment 133, a first connection segment 134, a third main segment 135, a second connection segment 136 and a fourth main segment 137.

The first main segment 131 may extend longitudinally in the first horizontal direction X. The second main segment 133 may be directly coupled to the first main segment 131 and may extend longitudinally in the second horizontal direction Y. The first connection segment 134 may be directly coupled to the second main segment 133 and may extend longitudinally in the first horizontal direction X. The third main segment 135 may be directly coupled to the first connection segment 134 and may extend longitudinally in the second horizontal direction Y. The second connection segment 136 may be directly coupled to the third main segment 135 and may extend longitudinally in the first horizontal direction X. The fourth main segment 137 may be directly coupled to the second connection segment 136 and may extend longitudinally in the second horizontal direction Y. The second main segment 133, the third main segment 135 and the fourth main segment 137 are arranged adjacent to each other (e.g., in the first horizontal direction X).

In addition, the first detection pattern 130 may further include a first sub segment 132a and a second sub segment 132b. The first sub segment 132a may be directly coupled to the first main segment 131 and may extend longitudinally in the second horizontal direction Y. The second sub segment 132b may be directly coupled to the first sub segment 132a, may extend longitudinally in the first horizontal direction X and may be connected to the first pad 41.

In addition, the first detection pattern 130 may further include a third sub segment 138 and a fourth sub segment 139. The third sub segment 138 may be directly coupled to the fourth main segment 137 and may extend longitudinally in the first horizontal direction X. In an embodiment, the third pad 43 may be coupled to an end of the fourth main segment 137. For example, the fourth sub segment 139 may be directly coupled to the third sub segment 138, may extend longitudinally in the second horizontal direction Y and may be connected to the third pad 43.

In an embodiment, the second detection patter 130a may include a first main segment, a second main segment, a first connection segment, a third main segment, a second connection segment and a fourth main segment.

The first main segment may extend longitudinally in the first horizontal direction X. The second main segment may be directly coupled to the first main segment and may extend longitudinally in the second horizontal direction Y. The first connection segment may be directly coupled to the second main segment and may extend longitudinally in the first horizontal direction X. The third main segment may be directly coupled to the first connection segment and may extend longitudinally in the second horizontal direction Y. The second connection segment may be directly coupled to the third main segment and may extend longitudinally in the first horizontal direction X. The fourth main segment may be directly coupled to the second connection segment and may extend longitudinally in the second horizontal direction Y.

In addition, the second detection pattern 130*a* may further include a first sub segment and a second sub segment. The first sub segment may be directly coupled to the first main segment and may extend longitudinally in the second horizontal direction Y. The second sub segment may be directly coupled to the first sub segment, may extend longitudinally in the first horizontal direction X and may be connected to the second pad 42.

In addition, the second detection pattern 130*a* may further include a third sub segment and a fourth sub segment. The third sub segment may be directly coupled to the fourth main segment and may extend longitudinally in the first horizontal direction X. In an embodiment, the fourth pad 44 may be coupled to an end of the fourth main segment of the second detection pattern. For example, the fourth sub segment may be directly coupled to the third sub segment, may extend longitudinally in the second horizontal direction Y and may be connected to the fourth pad 44.

As shown in FIG. 8, in an embodiment, the third detection pattern 140 may include a fifth main segment 141, a sixth main segment 143, a seventh main segment 145, an eighth main segment 147, a first connection segment CSG1, a second connection segment CSG2, a fifth sub segment 142, a sixth sub segment 144, a seventh sub segment 146 and an eighth sub segment 148.

The fifth main segment 141 of the third detection pattern 140 may extend in the diagonal direction having an angle of θ from the first horizontal direction X and the sixth main segment 143 may extend its the diagonal direction in parallel with the fifth main segment 141. The first connection segment CSG1 may connect the fifth main segment 141 and the sixth main segment 143 and may extend longitudinally in the first horizontal direction X. The fifth sub segment 142 may be directly coupled to the fifth main segment 141 and may extend longitudinally in the first horizontal direction X and the sixth sub segment 144 may be directly coupled to the fifth sub segment 142, may extend longitudinally in the second horizontal direction Y and may be connected to the fifth pad 45.

The seventh main segment 145 may be symmetric with the sixth main segment 143 with respect to the second horizontal direction Y and the eighth main segment 147 may be symmetric with the fifth main segment 141 with respect to the second horizontal direction Y. The second connection segment CSG2 may connect the seventh main segment 145 and the eighth main segment 147 and may extend longitudinally in the first horizontal direction X. The seventh sub segment 146 may be directly coupled to the eighth main segment 147 and may extend longitudinally in the first horizontal direction X and the eighth sub segment 148 may be directly coupled to the seventh sub segment 146, may extend longitudinally in the second horizontal direction Y and may be connected to the seventh pad 47.

In an embodiment, the fourth detection pattern 140*a* may include a fifth main segment, a sixth main segment, a seventh main segment, an eighth main segment, a first connection segment CSG1, a second connection segment, a fifth sub segment, a sixth sub segment, a seventh sub segment and an eighth sub segment.

The fifth main segment of the fourth detection pattern 140*a* may extend in the diagonal direction having an angle of θ from the first horizontal direction X and the sixth main segment may extend in the diagonal direction in parallel with the fifth main segment. The first connection segment may connect the fifth main segment and the sixth main segment and may extend longitudinally in the first horizontal direction X. The fifth sub segment may be directly coupled to the fifth main segment and may extend longitudinally in the first horizontal direction X and the sixth sub segment may be directly coupled to the fifth sub segment, and may extend longitudinally in the second horizontal direction Y and may be connected to the sixth pad 46.

The seventh main segment of the fourth detection pattern 140*a* may be symmetric with the sixth main segment with respect to the second horizontal direction Y and the eighth main segment may be symmetric, with the fifth main segment with respect to the second horizontal direction Y. The second connection segment may connect the seventh main segment and the eighth main segment and may extend longitudinally in the first horizontal direction X. The seventh sub segment may be directly coupled to the eighth main segment and may extend longitudinally in the first horizontal direction X and the eighth sub segment may be directly coupled to the seventh sub segment, may extend longitudinally in the second horizontal direction Y and may be connected to the eighth pad 48.

In an embodiment, respective gaps between the plurality of layers VL1, IL1, IL2 and VL2 may be filled with a prepreg PPG. In an embodiment, the layers VL1 and VL2 from among the plurality of layers VL1, IL1, IL2 and VL2 are voltage layers and may be connected to a power supply voltage or a ground voltage.

It is described as the first layer IL1 includes the first detection pattern 130 and the third detection pattern 140 with reference to FIGS. 6, 7 and 8. However, embodiments of the present disclosure are not limited thereto and in example embodiments the first layer IL1 may include any one of the first detection pattern 130 and the second detection pattern 130*a* and any one of the third detection pattern 140 and the fourth detection pattern 140*a*. In addition, it is described as the second layer IL2 includes the second detection pattern 130*a* and the fourth detection pattern 140*a* with reference to FIGS. 6, 7 and 8. However, embodiments of the present disclosure are not limited thereto and in example embodiments the second layer IL1 may include any one of the first detection pattern 130 and the second detection pattern 130*a* and any one, of the third detection pattern 140 and the fourth detection pattern 140*a*.

FIG. 9 illustrates an instance in which a misalignment does not occur in the PCB of FIG. 6 and each of FIGS. 10, 11 and 12 illustrates instances in which misalignments occur in the PCB of FIG. 9.

Referring to FIG. 9, when the misalignment does not occur in the PCB 101*b* and the PCB 101*b* has a normal alignment, the first detection pattern 130 and the second detection pattern 130*a* are overlapped with respect to each other in the vertical direction Z, and the third detection pattern 140 and the fourth detection pattern 140*a* are overlapped with respect to each other in the vertical direction Z.

Referring to FIG. 10, when the misalignment in the first horizontal direction X occurs in the PCB 101*b*, the first detection pattern 130 and the second detection pattern 130*a* are spaced apart from each other by a distance d11 in the first horizontal direction X and the third detection pattern 140 and the fourth detection pattern 140a are overlapped with respect to each other in the vertical direction Z.

Therefore, the amount of non-overlapping portions in the vertical direction Z between the first main segment in the first detection pattern 130 and the second main segment may increase.

Therefore, capacitive coupling between the first detection pattern 130 and the second detection pattern 130a is reduced. When the capacitive coupling between the first detection pattern 130 and the second detection pattern 130a is reduced, a differential characteristic impedance of the first detection pattern 130 and the second detection pattern 130a may increase.

Referring to FIG. 11, when the misalignment in the second horizontal direction Y occurs in the PCB 101b, the first detection pattern 130 and the second detection pattern 130a are spaced apart from each other by a distance d22 in the second horizontal direction Y and the third detection pattern 140 and the fourth detection pattern 140a are overlapped with respect to each other in the vertical direction Z.

Therefore, the amount of the non-overlapping portion in the vertical direction Z between the second main segment 133, the third main segment 135 and the fourth main segment 137 in the first detection pattern 130 and the second main segment, the third main segment and the fourth main segment in the second detection pattern 130a may increase. Therefore, capacitive coupling between the first detection pattern 130 and the second detection pattern 130a is reduced. When the capacitive coupling between the first detection pattern 130 and the second detection pattern 130a is reduced, a differential characteristic impedance of the first detection pattern 130 and the second detection pattern 130a may increase.

Referring to FIG. 12, when the misalignment in the diagonal direction occurs in the PCB 101b, the first detection pattern 130 and the second detection pattern 130a are overlapped with respect to each other in the vertical direction Z and the third detection pattern 140 and the fourth detection pattern 140a are spaced apart from each other by a distance d23 in the diagonal direction.

Therefore, the amount of the non-overlapping portions in the vertical direction Z between the fifth main segment 141, the sixth main segment 143, the seventh main segment 145 and the eighth main segment 147 in the third detection pattern 140 and the fifth main segment, the sixth main segment, the seventh main segment and the eighth main segment the fourth detection pattern 140a may increase. Therefore, capacitive coupling between the third detection pattern 140 and the fourth detection pattern 140a is reduced. When the capacitive coupling between the third detection pattern 140 and the fourth detection pattern 140a is reduced, a differential characteristic impedance of the third detection pattern 140 and the fourth detection pattern 140a may increase.

The TDR 20 may measure a first differential characteristic impedance of the first detection pattern 130 and the second detection pattern 130a through the first pad 41 and the second pad 42, may measure a second differential characteristic impedance of the first detection pattern 130 and the second detection pattern 130a through the third pad 43 and the fourth pad 44, and may detect the misalignment of the PCB 101b in the first horizontal direction X or in the second horizontal direction Y based on the first differential characteristic impedance and the second differential characteristic impedance.

The TDR 20 may detect the misalignment of the PCB 101b in the first horizontal direction X based on change of a value of the differential characteristic impedance associated with the first main segment 131 in the first detection pattern 110 and the first main segment in the second detection pattern 130a.

The TDR 20 may detect the misalignment of the PCB 101b in the second horizontal direction Y based on change of a value of the differential characteristic impedance associated with the second main segment 133, the third main segment 135 and the fourth main segment 137 in the first detection pattern 130 and the second main segment, the third main segment and the fourth main segment in the second detection pattern 130a.

The TDR 20 may measure a third differential characteristic impedance of the third detection pattern 140 and the fourth detection pattern 140a through the fifth pad 45 and the sixth pad 46, may measure a fourth differential characteristic impedance of the third detection pattern 140 and the fourth detection pattern 140a through the seventh pad 47 and the eighth pad 48, and may detect the misalignment of the PCB 101b in the diagonal direction based on the third differential characteristic impedance and the fourth differential characteristic impedance.

The TDR 20 may detect the misalignment of the PCB 101b in the diagonal direction based on change of a value of the differential characteristic impedance associated with the fifth main segment 141, the sixth main segment 143, the seventh main segment 145 and the eighth main segment 147 in the third detection pattern 140 and the fifth main segment, the sixth main segment, the seventh main segment and the eighth main segment in the fourth detection pattern 140a. For example, the TDR may detect misalignment of the PCB 101b in a first diagonal direction based on a change of value of the differential characteristic impedance associated with the fifth main segment 141 and the sixth main segment 143. The TDR may detect misalignment of the PCB 101b in a second diagonal direction that crosses the first diagonal direction based on the differential characteristic impedance associated with the seventh main segment 145 and the eighth main segment 147. In an embodiment, the first diagonal direction may be substantially perpendicular to the second diagonal direction.

FIG. 13 illustrates a differential characteristic impedance measured in the PCB of FIG. 6 using the TDR.

In FIG. 13, a first graph GP1 represents a first differential characteristic impedance of the first detection pattern 130 and the second detection pattern 130a measured at the first pad 41 and the second pad 42 and a second graph GP2 represents a second differential characteristic impedance of the first detection pattern 130 and the second detection pattern 130a measured at the third pad 43 and the fourth pad 44.

When the misalignment in the first horizontal direction X occurs in the PCB 101b of FIG. 6, the first differential characteristic impedance of the first detection pattern 130 and the second detection pattern 130a measured at the first pad 41 and the second pad 42 increases as a distance from the first pad 41 and the second pad 42 to the third pad 43 and the fourth pad 44, respectively, increases, and the second differential characteristic impedance of the first detection pattern 130 and the second detection pattern 130a measured at the third pad 43 and the fourth pad 44 decreases as a distance from the third pad 43 and the fourth pad 44 to the first pad 41 and the second pad 42, respectively, increases. In addition, because the first differential characteristic impedance crosses the second differential characteristic impedance at a point PST, the misalignment in the first horizontal direction X occurs at the point PST.

FIG. 14 is a cross-sectional view of a PCB according to example embodiments.

Referring to FIG. 14, a PCB 101c may include a plurality of layers VL1, IL and VL2 spaced apart from one another in the vertical direction Z.

A first reference layer RPL1 may be disposed in a first voltage layer VL1, a second reference layer RPL2 may be disposed in a second voltage layer VL2 and a detection pattern 110a may be provided in an intermediate layer IL that is positioned between the first voltage layer VL1 and the second voltage layer VL2 e.g., in the vertical direction Z).

The detection pattern 110a may be disposed such that an end of the detection pattern 110a in the first horizontal direction X is aligned with edges of the first reference layer RPL1 and the second reference layer RPL2 and the detection pattern 110a may extend longitudinally in the second horizontal direction Y which may be perpendicular to the first horizontal direction X.

In an embodiment, each of the first reference layer RPL1 and the second reference layer RPL2 may include a dielectric passage for forming a return path of a signal that is transmitted to a pad on the PCB 101c and at least one conductive line disposed in the dielectric passage and disposed to form a transmission path of the signal.

The detection pattern 110a may be connected to a pad 25 that is provided in the first voltage layer VL1 corresponding to an outmost layer through a via 114 and the pad 25 may be coupled to the TDR 20 shown in FIG. 1.

FIG. 15 illustrates an instance in which a misalignment occurs in the PCB of FIG. 14.

Referring to FIG. 15, when a misalignment in the first horizontal direction X occurs in the PCB 101c, the detection pattern 110a is not aligned with the edge of the second reference layer RPL2. When the detection pattern 110a is not aligned with the edge of the second reference layer RPL2, a capacitance of the detection pattern 110a changes and thus a characteristic impedance of the detection pattern 110a, measured through the pad 25, may change.

Therefore, in an embodiment, the TDR stores a characteristic impedance of the detection pattern 110a, measured in an instance in which the alignment in the PCB 101b is normal as a reference value, and may detect misalignment of the PCB 101c by comparing the characteristic impedance of the detection pattern 110a with the reference value.

The detection of the misalignment of the PCB described with reference to FIGS. 1 through 15 may be performed during a test process on the PCB during the manufacturing process of the PCB. In instances in which a degree of the misalignment of the PCB in the test process is greater than a threshold value, the PCB may be treated as a defective PCB because the PCB may degrade signals passing through the PCB at a relatively high speed.

A plurality of memory chips are mounted on a PCB that passes the test and may be provided as a memory module to consumers.

FIGS. 16A through 16D are cross-sectional diagrams showing a method of manufacturing a PCB according to example embodiments.

Referring to FIG. 16A, a first carrier substrate 510 which has a dummy layer 520, an insulating metal oxide layer 610p, and a first seed layer 620s on each of a top surface 512 and a bottom surface 514, is prepared and a second carrier substrate 710 which has a dummy layer 720, an insulating metal oxide layer 810p, and a first seed layer 820s on each of a top surface 712 and a bottom surface 714, is prepared.

For example, in an embodiment, the first carrier substrate 510 may be a prepreg, and the dummy layer 520 may be a copper foil. For example, the first carrier substrate 510 and the dummy layer 520 may be copper clad laminate (CCL). The first seed layer 620s may include a first metal, and the insulating metal oxide layer 610p may be an insulating metal oxide having a second metal different from the first metal. In an embodiment, the insulating metal oxide layer 610p may, for example, include aluminum oxide. The first seed layer 620s may, for example, include copper.

Description of the first carrier substrate 510 may be applied to the second carrier substrate 710 and a repeated description may be omitted for economy of explanation.

For example, the second carrier substrate 710 may be a prepreg, and the dummy layer 720 may be a copper foil. For example, the second carrier substrate 710 and the dummy layer 720 may be copper clad laminate (CCL). The first seed layer 820s may include a first metal, and the insulating metal oxide layer 810p may be an insulating metal oxide having a second metal different from the first metal. In an embodiment, the insulating metal oxide layer 810p may, for example, include aluminum oxide. The first seed layer 820s may, for example, include copper.

Referring to FIGS. 16A and 16B, a first plating layer 620p may be disposed via a plating operation using the first seed layer 620s as a seed. In an embodiment, the first plating layer 620p may be disposed via immersion plating, electroless plating, electroplating, or a combination thereof. The first plating layer 620p may include the same metal as the first metal constituting the first seed layer 620s. The first plating layer 620p may, for example, include copper. However, embodiments of the present disclosure are not limited thereto.

In example embodiments, if the insulating n e al oxide layer 610p includes a metal insulating oxide having a second metal different from the first metal, the first plating layer 620p may include a third metal different from the first metal and the second metal.

Figure 16C:
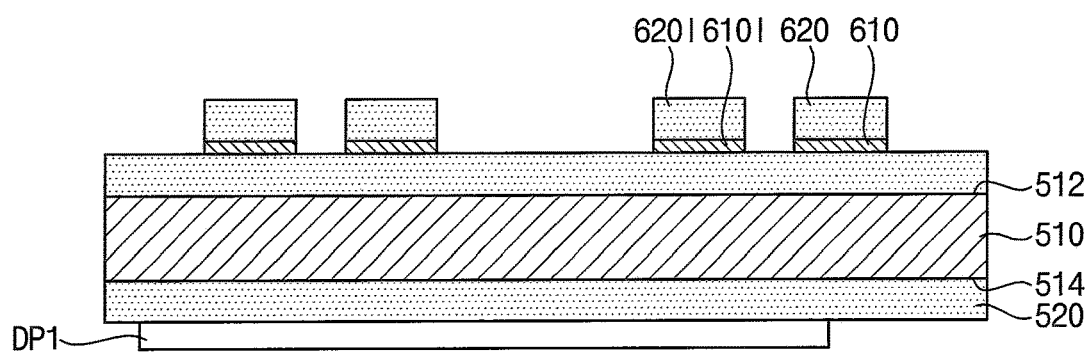
Figure 16C:
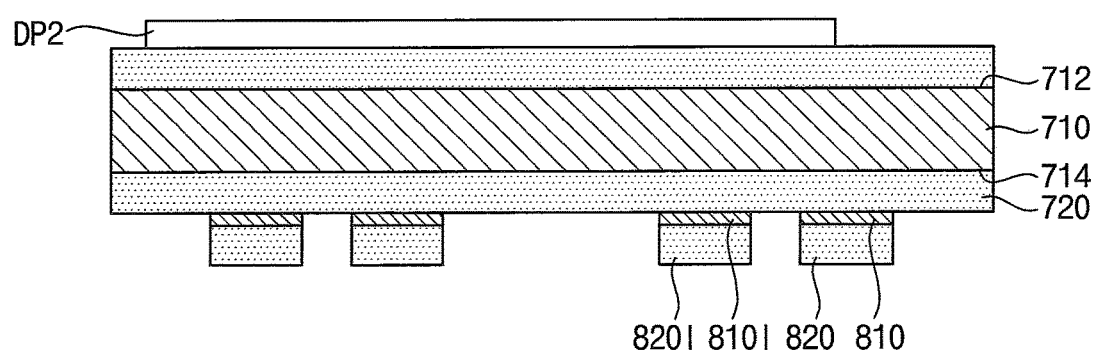

Referring to FIGS. 16B and 16C together, the insulating metal oxide layer 610p and the first plating layer 620p are patterned to dispose insulating metal oxide patterns, first plating patterns and a first detection pattern DP1. In addition, the insulating metal oxide layer 810p and the first plating layer 820p are patterned to dispose insulating metal oxide patterns, second plating patterns and a second detection pattern DP2.

The first plating patterns may include a first connection pad 620 and a first wire 620l. The insulating metal oxide patterns may include a first pad cover layer 610 and a wire cover layer 610l. In an embodiment, the first connection pad 620 and the first wire 620l constituting each of the first plating patterns are simultaneously disposed by patterning the first plating layer 620p. The first connection pad 620 may serve as a connection pad of a PCB, The first wire 620l may serve as a wire of the PCB. Therefore, the first connection pad 620 and the first wire 620l may include a same material.

Similarly, in an embodiment, the first pad cover layer 610 and the wire cover layer 610l constituting the insulating metal oxide patterns are simultaneously disposed by patterning the insulating metal oxide layer 610p. The first pad cover layer 610 covers the first connection pad 620. The wire cover layer 610l covers a top surface of the first wire 620l. Therefore, the first pad cover layer 610 and the wire cover layer 610l may include a same material.

The first pad cover layer 610 and the wire cover layer 610l cover a top surface of the first coinfection pad 620 and the top surface of the first wire 620l, respectively. A bottom surface of the first pad cover layer 610 and a bottom surface of the wire cover layer 610l are in direct contact with the top surface of the first connection pad 620 and the top surface of the first wire 120*l*, respectively.

Figure 16D:
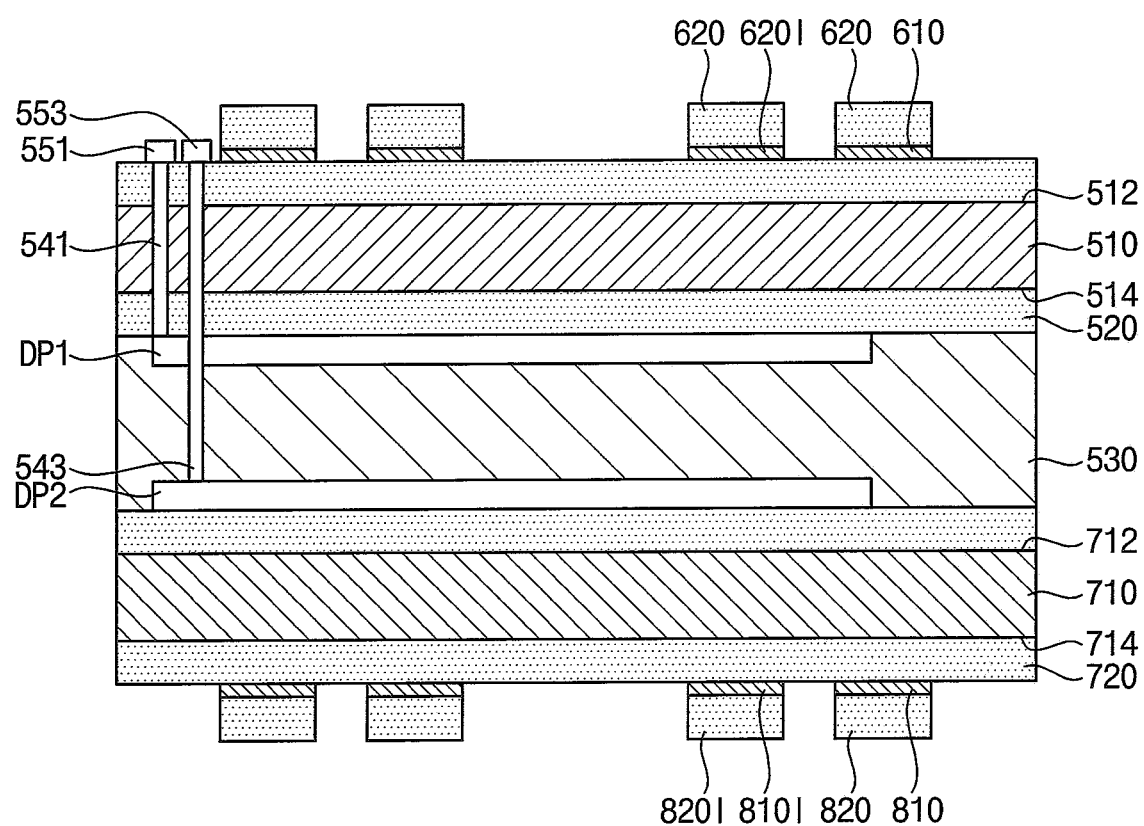

Referring to FIGS. 16C and 16D, the second carrier substrate 710, a base substrate layer 530 and the first carrier substrate 510 are stacked, a first via 541 connected to the first detection pattern DP1 and the second via 543 connected to the second detection pattern DP2 are formed, a first pad 551 connected to the first via 541 and a second pad 553 connected to the second via 543 are formed in the dummy layer 520. The first pad 551 and the second pad 553 may be coupled to the TDR 20 in FIG. 1.

When the PCB is manufactured based on processes with reference to FIGS. 16A through 16D, a misalignment of a PCB by which laser vias are employed and of a PCB by which through vias are employed are detected by using detection patterns.

FIG. 17 is a block diagram illustrating a memory module according to example embodiments.

Referring to FIG. 17 a memory module MMa may include a plurality of semiconductor memory devices 201*a*-201*d*, 202*a*-202*d*, 203*a*-203*e*, and 204*a*-204*e*, a plurality of data buffers 151-154 and 155-159 module resistance units 160 and 170, a registered clock driver (RCD) 190, a serial presence detect (SPD) chip 180 and a power management integrated circuit (PMIC) 185 which are mounted on a PCB 101. The RCD 190 may be referred to as a buffer chip.

Each of the plurality of semiconductor memory devices 201*a*-201*d*, 202*a*-202*d*, 203*a*-203*e*, and 204*a*-204*e* may be referred to as a memory chip.

The RCD 190 may control the plurality of semiconductor memory devices 201*a*-201*d*, 202*a*-202*d*, 203*a*-203*e*, and 204*a*-204*e* and the PMIC 185 under control of an external memory controller.

For example, the RCD 190 may receive an address ADDR, a command CMD, and/or clock signal CK from the memory controller. In response to the received signals, the RCD 190 may control the plurality of semiconductor memory devices 201*a*-201*d*, 202*a*-202*d*, 103*a*-203*e*, and 204*a*-204*e* such that data received through a data signal DQ and a data strobe signal DQS is written in the plurality of semiconductor memory devices 201*a*-201*d*, 202*a*-202*d*, 203*a*-203*e*, and 204*a*-204*e* or such that data stored in the plurality of semiconductor memory devices 201*a*-201*d*-202*a*-202*d*, 203*a*-203*e*, and 204*a*-204*e* is outputted through the data signal DQ and the data strobe signal DQS.

The plurality of semiconductor memory devices 201*a*-201*d*, 202*a*-202*d*, 203*a*-203*e*, and 204*a*-204*e* may write data received through the data signal DQ and the data strobe signal DQS under control of the RCD 190. Alternatively, the plurality of semiconductor memory devices 201*a*-201*d*-202*a*-202*d*, 203*a*-203*e*, and 204*a*-204*e* may output the written data through the data signal DQ and the data strobe signal DQS under control of the RCD 190.

For example, in an embodiment, each of the plurality of semiconductor memory devices 201*a*-201*d*, 202*a*-202*d*, 203*a*-203*e*, and 204*a*-204*e* may include a volatile memory device such as a dynamic random-access memory (DRAM), a static RAM (SRAM), or a synchronous DRAM (SDRAM). For example, the plurality of semiconductor memory devices 201*a*-201*d*, 202*a*-202*d*, and 204*a*-204*e* may be DRAM-based volatile memory devices.

The SPD chip 180 may be a programmable read only memory (e.g., EEPROM). The SPD chip 180 may include initial information or device information DI of the memory module MMa. In example embodiments, the SPD chip 180 may include the initial information or the device information DI such as a module form, a module configuration, a storage capacity, a module type, an execution environment, or the like of the memory module MMa.

When a memory system including the memory module MMa is booted up, the memory controller may read the device information DI from the SPD chip 180 and may recognize the memory module MMa based on the device information DI. The memory controller may control the memory module MMa based on the device information DI from the SPD chip 180. For example, the memory controller may recognize a type of the plurality of semiconductor memory devices 201*a*-201*d*, 202*a*-202*d*, 203*a*-203*e*, and 204*a*-204*e* included in the memory module MMa based on the device information DI from the SPD chip 180.

In example embodiments, the SPD chip 180 may communicate with the memos controller through a serial bus. For example, the memory controller may exchange a signal with the SPD chip 180 through the serial bus. The SPD chip 180 may also communicate with the RCD 190 through the serial bus. In an embodiment, the serial bus may include at least one of 2-line serial buses such as an inter-integrated circuit (I2C), a system management bus (SMBus), a power management bus (PMBus), an intelligent platform management interface (IPMI), a management component transport protocol (MCTP), or the like.

The PMIC 185 receives an input voltage VIN, generates a power supply voltage VDD based on the input voltage VIN, and provides the power supply voltage VDD to the plurality of semiconductor memory devices 201*a*-201*d*, 202*a*-202*d*, 203*a*-203*e*, and 204*a*-204*e* and or the RCD 190. The plurality of semiconductor memory devices 201*a*-201*d*, 202*a*-202*d*, 203*a*-203*e*, and 204*a*-204*e* operate based on the power supply voltage VDD. The input voltage VIN may be provided from the memory controller.

Here, the PCB 101 which is a printed circuit board may extend longitudinally in a first horizontal direction X which may be perpendicular to a second horizontal direction Y, between a first edge portion 103 and a second edge portion 105. The first edge portion 103 and the second edge portion 105 may extend longitudinally in the second horizontal direction Y.

The RCD 190 may be disposed on a center of the PCB 101 (e.g., in the first and second horizontal directions X, Y The plurality of semiconductor memory devices 201*a*-201*d*, 202*a*-202*d*, 203*a*-203*e*, and 204*a*-204*e* may be arranged in a plurality of rows between the RCD 190 and the first edge portion 103 and between the RCD 190 and the second edge portion 105.

In this embodiment, the semiconductor memory devices 201*a*-201*d* and 202*a*-202*d* may be arranged along a plurality of rows between the RCD 190 and the first edge portion 103. The semiconductor memory devices 203*a*-203*e*, and 204*a*-204*e* may be arranged along a plurality of rows between the RCD 190 and the second edge portion 105.

In an embodiment, a portion of the semiconductor memory devices 201*a*-201*e* and 202*a*-202*e* may lie an error correction code (ECC) memory device. The ECC memory device may perform an ECC encoding operation to generate parity bits about data to be written at memory cells of the plurality of semiconductor memory devices 201*a*-201*d*, 202*a*-202*d*, 203*a*-203*e*, and 204*a*-204*e*, and an ECC decoding operation to correct an error occurring in the data read from the memory cells.

Each of the plurality of semiconductor memory devices 201*a*-201*d*, 202*a*-202*d*, 203*a*-203*e*, and 204*a*-204*e* may be coupled to a corresponding one of the data buffers 155-159 and 151-154 through a data transmission line for receiving/transmitting the data signal DQ and the data strobe signal DQS.

The RCD 190 may provide a command/address signal to the semiconductor memory devices 201a-201d through a command/address transmission line 161 and may provide a command/address signal to the semiconductor memory devices 202a-202d through a command address transmission line 163. In addition, the RCD 190 may provide a command/address signal to the semiconductor memory devices 203a-203e through a command address transmission line 171 and may provide a command/address signal to the semiconductor met memory devices 204a-204e through a command/address transmission line 173.

The command/address transmission lines 161 and 163 may be connected in common to the module resistance unit 160 disposed to be adjacent to the first edge portion 103, and the command/address transmission lines 171 and 173 may be connected in common to the module resistance unit 170 disposed to be adjacent to the second edge portion 105. Each of the module resistance units 160 and 170 may include a termination resistor Rtt/2 connected to a termination voltage Vtt. In this embodiment, an arrangement of the module resistance units 160 and 170 may reduce the number of the module resistance units, thus reducing an area where termination resistors are disposed.

In addition, in an embodiment, each of the plurality of semiconductor memory devices 201a-201d, 202a-202d, 203a-203e, and 204a-204e may be a DDR5 SDRAM.

The SPD chip 180 is disposed to be adjacent to the RCD 190 (e.g., in the second horizontal direction Y and the PMIC 185 may be disposed between the semiconductor memory device 203e and the second edge portion 105 (e.g., in the first horizontal direction X). The PMIC 185 may generate the power supply voltage VDD based on the input voltage VIN and may provide the power supply voltage VDD to the plurality of semiconductor memory devices 201a-201d, 202a-202d, 203a-203e, and 204a-204e.

Although it is illustrated as the PMIC 185 is disposed to be adjacent to the second edge portion 105 in FIG. 17, embodiments of the present disclosure are not limited thereto. For example, the PMIC 185 may be disposed in a central portion of the PCB 101 (e.g., in the first and second horizontal directions X, Y) to be adjacent to the RCD 190 in example embodiments.

The PCB 101 may employ one of the PCB 101a of FIG. 1, the PCB 101b of FIG. 6 and the PCB 101c of FIG. 12. Therefore, a plurality of pads 41, 42, 43 44, 45, 46, 47 and 48 may be provided in the PCB 101 a pair of adjacent pads from among the plurality of pads 41, 42, 43 44, 45, 46, 47 and 48 may be coupled to the TDR 20 in FIG. 1.

The PCB 101 may include a plurality of layers spaced apart from one other in the vertical direction, a first detection pattern and a second detection pattern which are provided in a respective one of a first layer and a second layer adjacent to each other in the vertical direction from among the plurality of layers such that the first detection pattern and the second detection pattern are opposed to each other (e.g., in the vertical direction).

Each of the first detection pattern and the second detection may include at least one main segment extending in at least one of the first horizontal direction X, the second horizontal direction Y which may be perpendicular to the first horizontal direction X and a diagonal direction between the first horizontal direction X and the second horizontal direction Y.

The TDR 20 may detect a misalignment of the PCB 101 by measuring a differential characteristic impedance of the first detection pattern and the second detection pattern at the pair of pads and the plurality of semiconductor memory devices 201a-201d, 202a-202d, 203a-203e, and 204a-204e may be mounted on the PCB 101 when the misalignment of the PCB 101 is less than a threshold value.

In an embodiment, the first detection pattern and the second detection pattern may be provided in a region in which circuit elements are not formed in the PCB 101.

FIG. 18 is a block diagram illustrating one of the semiconductor memory devices in the memory module of FIG. 17 according to example embodiments.

Referring to FIG. 18, the semiconductor memory device 201a may include a control logic circuit 210, an address register 220, a hank control logic 230, a row address multiplexer 240, a column address latch 250, a row decoder 260, a column decoder 270, a memory cell array 300, a sense amplifier unit. 285, an input/output (I/O) gating circuit 290, a data input/output (110) buffer 295, a refresh counter 245 and an FCC engine 297.

The memory cell array 300 may include first through eighth bank arrays 310a-310h. The memory cell array 300 may operate based on the power supply voltage VDD.

In an embodiment, the row decoder 260 may include first through eighth bank row decoders 260a-260h coupled to the first through eighth bank arrays 310a-310h, respectively, the column decoder 270 may include first through eighth bank column decoders 270a-270h coupled to the first through eighth bank arrays 310a-310h, respectively, and the sense amplifier unit 285 may include first through eighth bank sense amplifiers 285a-285b coupled to the first through eighth bank arrays 310a-310h, respectively.

The first through eighth bank arrays 310a-310h, the first through eighth bank row decoders 260a-260h, the first through eighth bank column decoders 270a-270h, and the first through eighth bank sense amplifiers 285a-285h may form first through eighth banks. In an embodiment, each of the first through eighth bank arrays 310a-310h may include a plurality of word-lines WL, a plurality of bit-lines BL, and a plurality of memory cells MC formed at intersections of the word-lines WL and the bit-lines BTL.

Although the semiconductor memory device 201a is illustrated in FIG. 18 as including eight banks, embodiments of the present disclosure are not limited thereto and the semiconductor memory device 201a may include any number of banks.

The address register 220 may receive the address ADDR including a bank address BANK_ADDR, a row address ROW_ADDR, and a column address COL_ADDR from the control device 500. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bark row decoders 260a-260h corresponding to the bank address BANK_ADDR may be activated in response to the bank control signals, and one of the first through eighth bank column decoders 270a-270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a-260h.

The activated one of the first through eighth bank row decoders 260a-260h may decode the row address RA that is output from the row address multiplexer 240, and may activate a word-line WL corresponding to the row address RA. For example, the activated bank row decoder may generate a word-line driving voltage based on the power supply voltage and may apply the word-line driving voltage to the word-line WL corresponding to the row address RA.

The column address latch 250 may receive the column address COL_ADDR from the address register 220, and may temporarily store the received column address COL_ADDR. In example embodiments, in a burst mode, the column address latch 250 may generate column addresses COL_ADDR' that increment from the received column address COL_ADDR, The column address latch 250 may apply the temporarily stored or generated column address COL_ADDR' to the first through eighth bank column decoders 270a-270h.

The activated one of the first through eighth bank column decoders 270a-270h may decode the column address COL_ADDR that is output from the column address latch 250, and may control the 110 gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310a-310h, and write control devices for writing data to the first through eighth bank arrays 310a-310h.

Data to be read from one of the first through eighth bank arrays 310a-310h may be sensed by a sense amplifier coupled to the one bank array from which the data is to be read, and may be stored in the read data latches.

The data stored in the read data latches may be provided to the memory controller via the data I/O buffer 295 after the ECC engine 297 performs an ECC decoding on the data (e.g., a codeword CW). Data to be written in one of the first through eighth bank arrays 310-380 may be provided to the data I/O buffer 295 from the memory controller. The ECC engine 297 performs an ECC encoding on the data provided to the data 110 buffer 295, and the ECC engine 297 provides the encoded data (e.g., the codeword CW) to the I/O gating circuit 290.

The data I/O buffer 295, in a write operation, provides the data signal DQ to the ECC engine 297. The data I/O buffer 295, in a read operation, receives the data signal DQ from the ECC engine 297 and provides the data signal DQ and the date strobe signal DQS to the memory controller.

The control logic circuit 210 may control operations of the semiconductor memory device 201a. For example, the control logic circuit 210 may generate control signals for the memory device 201a to perform the write operation or the read operation. The control logic circuit 210 may include a command decoder 211 that decodes the command CMD received from the memory controller through the control device 500a and a mode register 212 that sets an operation mode of the semiconductor memory device 201a.

For example, in an embodiment, the command decoder 211 may generate the control signals corresponding to the command CMD by decoding a write enable signal, a row address strobe signal, a column address strobe signal, a chip select signal, etc.

FIG. 19 illustrates a first bank array of the semiconductor memos device of FIG. 18 according to example embodiments.

Referring to FIG. 19, the first bank array 310a may include a plurality of word-lines WL1-WL2m, in which m is a natural number greater than two, a plurality of bit-lines BTU-BTL2n, in which n is a natural number greater than two, and a plurality of memory cells MCs disposed near intersections between the word-lines WL1-WL2m and the bit-lines BTL1-BTL2n. In an example embodiment of the present disclosure, each of the plurality of memory cells MCs may include a DRAM cell structure. The plurality of word-lines WL1-WL2m to which the plurality of memory cells MCs are connected may be referred to as rows of the first bank array 310a and the plurality of bit-lines BL1-BL3n to which the plurality of memory cells MCs are connected may be referred to as columns of the first bank array 310a.

FIG. 20 is it block diagram illustrating another example of the memory module according to example embodiments.

Referring to FIG. 20, a memory module MMb may include a plurality of semiconductor memory devices 201a-201d, 202a-202d, 203a-203e, and 204a-204e, module resistance traits 160 and 170, a RCD 190a, a SPD chip 180, and a PMIC 185 which are mounted on a PCB 101.

A memory module MMb of FIG. 20 differs from the memory module MMa of FIG. 17 in that the memory module MMb does not include data buffers which receive/transmit the data signal DQ and the data strobe signal DQS from/to the plurality of semiconductor memory devices 201a-201d, 202a-202d, 203a-203e, and 204a-204e. In an embodiment, the memory module MMb may receive/transmit the data signal DQ and the data strobe signal DQS from to the memory controller through the RCD 190a.

The PCB 101 may employ one of the PCB 101a of FIG. 1, the PCB 101b of FIG. 6 and the PCIS 101c of FIG. 12. Therefore, a plurality of pads 41, 42, 43 44, 45, 46, 47 and 48 may be provided in the PCB 101 a pair of adjacent pads from among the plurality of pads 41, 42, 43 44, 45, 46, 47 and 48 may be coupled to the TDR 20 in FIG. 1.

The PCB 101 may include a plurality of layers spaced apart from one other in the vertical direction, a first detection pattern and a second detection pattern which are provided in respective one of a first layer and a second layer adjacent to each other in the vertical direction from among the plurality of layers such that the first detection pattern and the second detection pattern are opposed to each other.

Each of the first detection pattern and the second detection may include at least one main segment extending in at least one of the first horizontal direction X, a second horizontal direction Y which may be perpendicular to the first direction and a diagonal direction between the first horizontal direction X and the second horizontal direction Y.

The TDR 20 may detect a misalignment of the PCB 101 by measuring a differential characteristic impedance of the first detection pattern and the second detection pattern at the pair of pads and the plurality of semiconductor memory devices 201a-201d, 202a-202d, 203a-203e, and 204a-204e may be mounted on the PCB 101 when the misalignment of the PCB 101 is less than a threshold value.

The first detection pattern and the second detection and the second detection pattern may be provided in a region in which circuit elements are not formed in the PCB 101.

FIG. 21 is a block diagram illustrating a memory system according to example embodiments.

Referring to FIG. 21, in a memory system 1000, a memory controller 1100 and a plurality of connecting sockets 1400, which are mounted on a main board 1300, are connected through a system bus 1200.

The memory controller 1100 may be a system on chip having a memory control function. A desired number of the memory modules MM1, MM2 and MM3 may be coupled in the connecting sockets 1400, and a plurality of memory chips may be mounted on each of the memory modules MM1, MM2 and MM3. Termination resistors 1500 may be disposed on the main board 1300 for impedance matching.

The example embodiments as described above may be applied to memory modules systems employing a multi-layered PCB.

While the present disclosure has been shown and described above with reference to non-limiting example embodiments thereof, it will be apparent to those of ordinary skill in the art that modifications and variations in form and details may be made thereto without departing from the spirit and scope of the present disclosure.

What is claimed is:

1. A printed circuit board (PCB) comprising:
a plurality of layers spaced apart from one another in a vertical direction, the plurality of layers including a first layer and a second layer adjacent to each other in the vertical direction;
a first detection pattern and a second detection pattern disposed in a respective one of the first layer and the second layer, the first detection pattern and the second detection pattern are opposed to each other in the vertical direction; and
a plurality of pads connected to the first detection pattern and the second detection pattern, the plurality of pads is disposed in an outmost layer from among the plurality of layers,
wherein each of the first detection pattern and the second detection pattern includes at least one main segment extending in at least one of a first horizontal direction, a second horizontal direction perpendicular to the first horizontal direction and a diagonal direction between the first horizontal direction and the second horizontal direction,
wherein a pair of pads from among the plurality of pads are connected to a time domain reflectometry (TDR), and
wherein the TDR is configured to detect a misalignment of the PCB by measuring a differential characteristic impedance of the first detection pattern and the second detection pattern at the pair of pads.

2. The PCB of claim 1, wherein each of the first detection pattern and the second detection pattern includes:
a first main segment extending in the first horizontal direction; and
a second main segment, a third main segment and a fourth main segment that are connected to the first main segment, extend in the second horizontal direction and are arranged adjacent to each other, and
wherein the plurality of pads include:
a first pad coupled to an end of the first main segment of the first detection pattern;
a second pad coupled to an end of the first main segment of the second detection pattern;
a third pad coupled to an end of the fourth main segment of the first detection pattern; and
a fourth pad coupled to an end of the fourth main segment of the second detection pattern.

3. The PCB of claim 2, wherein:
the first pad is coupled to the end of the first main segment of the first detection pattern through a first via;
the second pad is coupled to the end of the first main segment of the second detection pattern through a second via;
the third pad is coupled to the end of the fourth main segment of the first detection pattern through a third via; and
the fourth pad is coupled to the end of the fourth main segment of the second detection pattern through a fourth via.

4. The PCB of claim 2, wherein the TDR is configured to:
measure a first differential characteristic impedance of the first detection pattern and the second detection pattern through the first pad and the second pad;
measure a second differential characteristic impedance of the first detection pattern and the second detection pattern through the third pad and the fourth pad; and
detect the misalignment of the PCB based on the first differential characteristic impedance and the second differential characteristic impedance.

5. The PCB of claim 4, wherein the TDR is configured to determine whether the misalignment in the first horizontal direction occurs:
in response to a first value of the first differential characteristic impedance increasing as a distance from the first pad and the second pad to the third pad and the fourth pad, respectively, increases; and
in response to a second value of the second differential characteristic impedance decreasing as a distance from the third pad and the fourth pad to the first pad and the second pad, respectively, increases.

6. The PCB of claim 2, wherein the TDR is configured to determine whether the misalignment in the first horizontal direction occurs based on change of a value of the differential characteristic impedance associated with the first main segment.

7. The PCB of claim 2, wherein the TDR is configured to determine whether the misalignment in the second horizontal direction occurs based on change of a value of the differential characteristic impedance associated with the second main segment, the third main segment and the fourth main segment.

8. The PCB of claim 2, further comprising:
a third detection pattern and a fourth detection pattern which are disposed in a respective one of the first layer and the second layer such that the third detection pattern and the fourth detection pattern are opposed to each other in the vertical direction, the third detection pattern being separate from the first detection pattern, the fourth detection pattern being separate from the second detection pattern,
wherein each of the third detection pattern and the fourth detection pattern includes:
a fifth main segment and a sixth main segment extending in the diagonal direction and being adjacent to each other;
a seventh main segment symmetric with the sixth main segment with respect to the second horizontal direction; and
an eighth main segment symmetric with the fifth main segment with respect to the second horizontal direction,
wherein the plurality of pads further include:
a fifth pad coupled to an end of the fifth main segment of the third detection pattern;
a sixth pad coupled to an end of the fifth main segment of the fourth detection pattern;
a seventh pad coupled to an end of the eighth main segment of the third detection pattern; and an eighth pad coupled to an end of the eighth main segment of the fourth detection pattern.

9. The PCB of claim 8, wherein the TDR is configured to:
measure a first differential characteristic impedance of the third detection pattern and the fourth detection pattern through the fifth pad and the sixth pad;
measure a second differential characteristic impedance of the third detection pattern and the fourth detection pattern through the seventh pad and the eighth pad; and
detect the misalignment of the PCB based in the diagonal direction based on the first differential characteristic impedance and the second differential characteristic impedance.

10. The PCB of claim 8, wherein each of the third detection pattern and the fourth detection pattern further includes:
a first connection segment that connects the fifth main segment and the sixth main segment in the first horizontal direction; and
a second connection segment that connects the seventh main segment and the eighth main segment in the first horizontal direction.

11. The PCB of claim 10, wherein the TDR is configured to determine whether the misalignment in a diagonal direction in the PCB occurs based on change of a value of the differential characteristic impedance associated with the fifth main segment and the sixth main segment.

12. The PCB of claim 10, wherein the TDR is configured to determine whether the misalignment in a first diagonal direction that crosses the diagonal direction in the PCB occurs based on change of a value of the differential characteristic impedance associated with the seventh main segment and the eighth main segment.

13. The PCB of claim 1,
wherein each of the first detection pattern and the second detection pattern includes a first segment extending in the first horizontal direction,
wherein the plurality of pads include:
a first pad coupled to an end of the first segment of the first detection pattern; and
a second pad coupled to an end of the first segment o the second detection pattern, and
wherein the first pad is coupled to the end of the first segment of the first detection pattern through a first via and the second pad is coupled to the end of the first segment of the second detection pattern through a second via.

14. The PCB of claim 13, wherein the TDR is configured to:
measure the differential characteristic impedance of the first detection pattern and the second detection pattern through the first pad and the second pad; and
detect the misalignment of the PCB in the second horizontal direction based on the differential characteristic impedance.

15. A printed circuit board (PCB) comprising:
a plurality of layers spaced apart from one another in a vertical direction, the plurality of layers including a first reference layer and a second reference layer;
a detection pattern disposed in an intermediate layer positioned between the first reference layer and the second reference layer in the vertical direction; and
a pad connected to the detection pattern, the pad disposed in an outmost layer from among the plurality of layers,
wherein an end of the detection pattern in a first horizontal direction is aligned with edges of the first reference layer and the second reference layer and the detection pattern extends in a second horizontal direction perpendicular to the first horizontal direction,
wherein the pad is connected to a time domain reflectometry (TDR), and
wherein the TDR is configured to detect a misalignment of the PCB by measuring a characteristic impedance of the detection pattern.

16. The PCB of claim 15, wherein the TDR is configured to determine whether the misalignment occurs in the PCB based on change of a value of the characteristic impedance.

17. The PCB of claim 16, wherein the TDR is configured to determine that the misalignment occurs in the PCB in response to the value of the characteristic impedance being greater than a reference value.

18. A memory module comprising:
a printed circuit board (PCB);
a plurality of semiconductor devices mounted on the PCB, each of the plurality of semiconductor devices including a memory cell array to store data; and
a registered clock driver (RCD) mounted on the PCB, the RCD is configured to receive a command and an access address from an external device and to provide the command and the access address to the plurality of semiconductor memory devices,
wherein the PCB includes:
a plurality of layers spaced apart from one another in a vertical direction, the plurality of layers including a first layer and a second layer adjacent to each other in the vertical direction;
a first detection pattern and a second detection pattern that are disposed in the first layer and the second layer, the first detection pattern and the second detection pattern are opposed to each other in the vertical direction; and
a plurality of pads connected to the first detection pattern and the second detection pattern, the plurality of pads is disposed in an outmost layer among the plurality of layers,
wherein each of the first detection pattern and the second detection pattern includes at least one main segment extending in at least one of a first horizontal direction, a second horizontal direction perpendicular to the first horizontal direction and a diagonal direction between the first horizontal direction and the second horizontal direction,
wherein a pair of pads from among the plurality of pads are connected to a time domain reflectometry (TDR), and
wherein the TDR is configured to detect a misalignment of the PCB by measuring a differential characteristic impedance of the first detection pattern and the second detection at the pair of pads.

19. The memory module of claim 18,
wherein each of the first detection pattern and the second detection pattern includes:
a first segment extending in the first horizontal direction;
a second segment coupled to the first segment and extending in the second horizontal direction;
a third segment extending in the diagonal direction;
a fourth segment symmetric with the third segment with respect to the second horizontal direction, and
wherein the plurality of pads includes:
a first pad coupled to an end of the first segment of the first detection pattern;
a second pad coupled to an end, of the first segment of the second detection pattern;
a third pad coupled to an end of the second segment of the first detection pattern;

a fourth pad coupled to an end of the second segment of the second detection pattern;

a fifth pad coupled to an end of the third segment of the first detection pattern;

a sixth pad coupled to an end of the third segment of the second detection pattern;

a seventh pad coupled to an end of the fourth segment of the first detection pattern;

an eighth pad coupled to an end of the fourth segment of the second detection pattern.

20. The memory module of claim 19, wherein the TDR is configured to:

measure a first differential characteristic impedance of the first detection pattern and the second detection pattern through the first pad and the second pad;

measure a second differential characteristic impedance of the first detection pattern and the second detection pattern through the third pad and the fourth pad; and detect the misalignment of the PCB based on the first differential characteristic impedance and the second differential characteristic impedance, and wherein the TDR is further configured to:

measure a third differential characteristic impedance of the first detection pattern and the second detection pattern through the fifth pad and the sixth pad;

measure a fourth differential characteristic impedance of the first detection pattern and the second detection pattern through the seventh pad and the eighth pad; and detect the misalignment of the PCB in the diagonal direction based on the third differential characteristic impedance and the fourth differential characteristic impedance.

* * * * *